(12) United States Patent
Wu et al.

(10) Patent No.: US 7,719,837 B2
(45) Date of Patent: May 18, 2010

(54) METHOD AND APPARATUS FOR COOLING A BLADE SERVER

(76) Inventors: Shan Ping Wu, 134 Linden Ave., Westbury, NY (US) 11590; Shan Hua Wu, 134 Linden Ave., Westbury, NY (US) 11590

( * ) Notice: Subject to any disclaimer, the term of this patent is extended or adjusted under 35 U.S.C. 154(b) by 939 days.

(21) Appl. No.: 11/507,943

(22) Filed: Aug. 22, 2006

(65) Prior Publication Data
US 2007/0042514 A1 Feb. 22, 2007

Related U.S. Application Data

(60) Provisional application No. 60/710,325, filed on Aug. 22, 2005.

(51) Int. Cl.
*H05K 7/20* (2006.01)
(52) U.S. Cl. .................. 361/699; 361/700; 361/719; 361/720; 174/15.1; 174/15.2; 165/80.4; 165/104.26; 165/104.33
(58) Field of Classification Search .................. None
See application file for complete search history.

(56) References Cited

U.S. PATENT DOCUMENTS

| | | | | |
|---|---|---|---|---|
| 6,055,157 | A * | 4/2000 | Bartilson | 361/699 |
| 6,643,132 | B2 * | 11/2003 | Faneuf et al. | 361/700 |
| 6,804,117 | B2 * | 10/2004 | Phillips et al. | 361/700 |
| 6,807,056 | B2 * | 10/2004 | Kondo et al. | 361/689 |
| 6,972,365 | B2 * | 12/2005 | Garner | 174/16.3 |
| 7,013,955 | B2 * | 3/2006 | Phillips et al. | 165/104.21 |
| 7,133,283 | B2 * | 11/2006 | Faneuf et al. | 361/689 |
| 7,397,662 | B2 * | 7/2008 | Oyamada | 361/699 |
| 7,428,151 | B2 * | 9/2008 | Sonnabend et al. | 361/699 |
| 2006/0171117 | A1 * | 8/2006 | Hamman | 361/699 |
| 2007/0297136 | A1 * | 12/2007 | Konshak | 361/699 |

OTHER PUBLICATIONS

Verax Quattro 1 Heatsink,www.frostytech.com/articleview.cfm?articleID=1972, pp. 1-5 (2006).
EVO 98, www.akasa.com.tw/akasa_english/spec_page/coolers/spec_ak_921.htm, pp. 1-6 (2006).
Zalman CNPS8000, www.zalman.co,kr/images/product_img/cooling/tnn300_02_01b.jpg, pp. 1-4 (2006).
Thermaltake Sonic Tower CL-P0071, www.thermaltakeusa.com/product/Cooler/Retail/cl-p0071/cl-p0071.asp, pp. 1-5 (2006).

* cited by examiner

*Primary Examiner*—Boris L Chervinsky
(74) *Attorney, Agent, or Firm*—Hoffmann & Baron, LLP

(57) ABSTRACT

A method and apparatus adapted to cool a circuit board in a rack-mountable housing includes transferring heat from a heat source on the board to a primary heat storage medium positioned at an edge of the board or within a rack-mountable housing using at least one heat pipe, transferring heat from the primary heat storage medium to a secondary heat storage medium positioned in the rack-mountable housing through contacting surfaces of the primary and secondary heat storage mediums, transferring heat from the secondary heat storage medium to a heat exchanger, which may be positioned within the rack-mountable housing, using at least one heat pipe, and cooling the heat exchanger. A method and apparatus adapted to cool a printed circuit board includes transferring heat from a heat source on the board to a heat exchanger positioned in the rack-mountable housing using at least one heat pipe, and cooling the heat exchanger.

14 Claims, 25 Drawing Sheets

Front View of a blade unit and the secondary heat storage medium

METHOD AND APPARATUS FOR COOLING A BLADE SERVER

CROSS REFERENCE TO RELATED APPLICATION

This application claims the benefit of U.S. Provisional Application No. 60/710,325 filed on Aug. 22, 2005, the disclosure of which is incorporated herein by reference.

BACKGROUND OF THE INVENTION

1. Field of the Invention

The present invention relates to methods of cooling printed circuit boards in an enclosure, and more particularly relates to cooling blade servers in a rack-mounted enclosure using heat transfer through surface contact and forced air.

2. Description of the Related Art

A blade server is a single circuit board populated with components, such as processors, memory, and network connections that are usually found on multiple boards. Blade servers are designed to slide into enclosures. Blade servers are more cost-efficient, smaller, and consume less power than traditional rack-based servers.

Current blade server designers face many design challenges. One of the key challenges is minimizing overall design costs. Another is keeping blade server electronic components cool and within their operating specifications. Yet another is maintaining accessibility (easy removal and reattachment) of the individual blade server from a housing unit. A successful blade server design must address these critical issues, that is, heat, accessibility, and costs.

A popular cost-saving blade server design approach utilizes Commercial Off-the-Shelf (COTS) products, such as the industry standard MicroATX, ATX, BTX, EATX form-factor motherboards. Unfortunately, the COTS design approach has many inherent design deficiencies. In reality, most COTS motherboards are not designed to fit into slim-style, height-restricted blade enclosures. Rather, they are designed for spacious computer enclosures with plenty of headroom for the component cooling devices. In addition, utilizing COTS motherboards in blade server designs hinders blade accessibility due to non-uniform I/O connector height. Nevertheless, COTS motherboards are readily available and can be purchased cheaply on the market. The cost saving is a very compelling reason for blade designers to utilize COTS motherboards in their blade server designs.

SUMMARY OF THE INVENTION

A method of cooling a circuit board in a rack-mountable housing is provided in accordance with the present invention, which includes transferring heat from a heat source on the circuit board to a primary heat storage medium positioned at an edge of the circuit board using at least one heat pipe, transferring heat from the primary heat storage medium to a secondary heat storage medium through contacting surfaces of the primary and secondary heat storage mediums in thermal contact with each other, transferring heat from the secondary heat storage medium to a heat exchanger using at least one heat pipe, and cooling the heat exchanger.

The primary and secondary heat storage mediums may include at least one of aluminum, copper and/or other heat transferring materials. The method may also include sloping the contacting surfaces of the primary and secondary heat storage mediums complementarily such that the contacting surfaces are forced against each other in response to the rack-mountable housing being inserted in a rack, as shown in FIGS. 11 and 12. The heat exchanger may include at least one of fins or a water chiller.

A method of cooling a circuit board in a rack-mountable housing is provided in further accordance with the present invention, which includes transferring heat from a heat source on the circuit board to a primary heat storage medium positioned in the rack-mountable housing using at least one heat pipe, transferring heat from the primary heat storage medium to a secondary heat storage medium positioned in the rack-mountable housing through contacting surfaces of the primary and secondary heat storage mediums in thermal contact with each other, transferring heat from the secondary heat storage medium to a heat exchanger positioned in the rack-mountable housing using at least one heat pipe, and cooling the heat exchanger.

The method may further include adapting the primary and secondary heat storage mediums such that a position of at least one of the secondary heat storage medium and the heat exchanger is adjustable with respect to a position of the primary heat storage medium.

A method of cooling a circuit board in a rack-mountable housing is provided in still further accordance with the present invention, which includes transferring heat from a heat source on the circuit board to a heat exchanger positioned in the rack-mountable housing using at least one heat pipe, and cooling the heat exchanger.

These and other objects, features, and advantages of the invention will become apparent from the following detailed description of illustrative embodiments thereof, which is to be read in connection with the accompanying drawings.

DETAILED DESCRIPTION OF THE PREFERRED EMBODIMENTS

Figure 1:
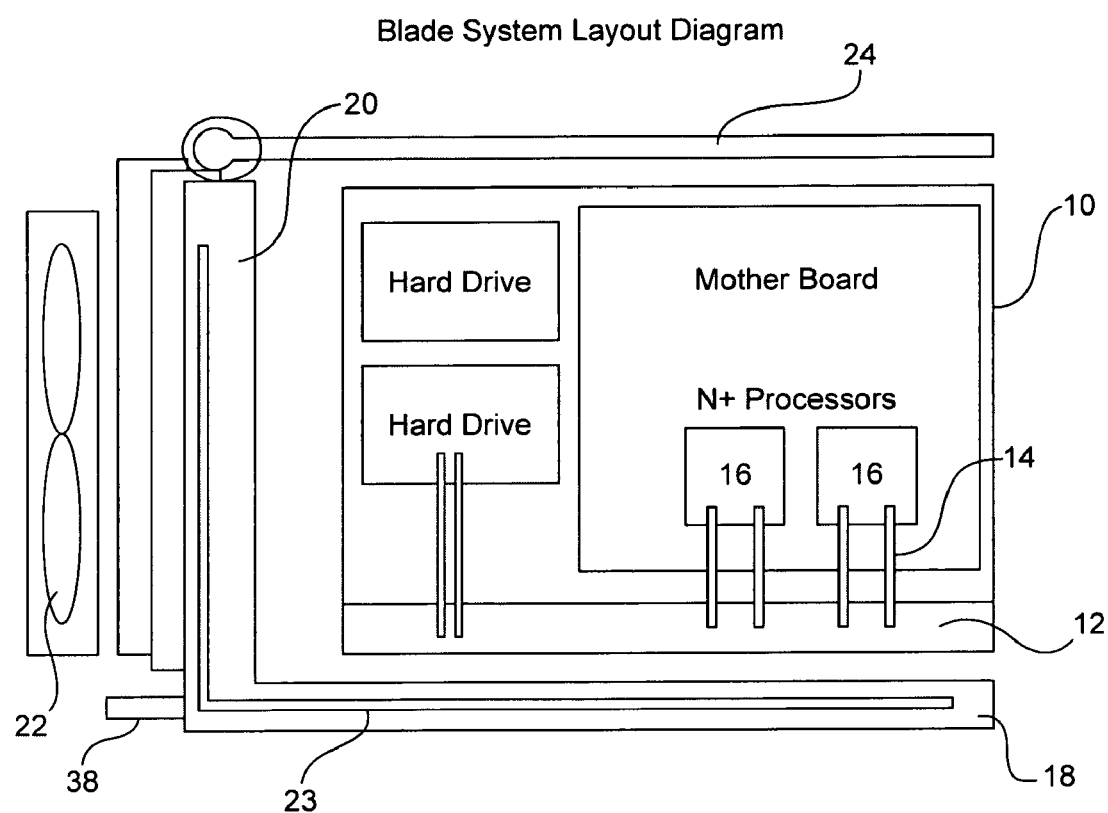
FIG. 1 is a side view of a first embodiment of an apparatus for cooling a blade server in accordance with the present invention.

A first embodiment of a blade server design that utilizes a three-step heat transfer and cooling technique is shown in FIGS. 1-7, which addresses the heat and accessibility issues presented in the prior art.

The first step in the three-step technique of the first embodiment is transferring heat from heat sources on the blade server 10 to primary heat storage mediums 12 through a series of heat pipes 14. A heat pipe is a device that can quickly transfer heat from one point to another. Heat pipes are often referred to as "superconductors" of heat since they possess an extraordinary heat transfer capacity and rate with almost no heat loss.

Heat pipes preferably include a sealed aluminum or cooper container whose inner surfaces have a capillary wicking material. A heat pipe is similar to a thermosyphon. However, heat pipes differ from a thermosyphons by virtue of their ability to transport heat against the gravitational forces present in an evaporation-condensation cycle with the help of porous capillaries that form a wick. The wick provides the capillary driving force to return the condensate to the evaporator. The quality and type of wick usually determines the performance of the heat pipe. Different types of wicks are used depending on the application for which the heat pipe is being used.

Heat sources 16 can be any heat generating devices, such as high-speed computer processors, hard disks, memory chips, or power supplies. The primary heat storage mediums 12 can be any large blocks of aluminum, copper and/or other heat transferring materials that are preferably formed in a rectangular shape.

The second step includes transferring heat from the primary heat storage mediums 12 to secondary heat storage mediums 18 through direct surface contact. The surfaces of the mediums are preferably smooth to provide for the most efficient transfer of heat. The ability to separate and reattach the primary and secondary heat storage mediums is preferred in the three-step cooling design of the first embodiment. This feature helps to maintain and improve physical access to the blade server 10, that is, the quick removal, reattachment, and/or reinsertion of blade servers in their housing or enclosure.

The third step in the process includes transferring heat from the secondary heat storage mediums 18 to a heat exchanger 20, including a fan 22, water cooler, and/or alternative liquid coolant for further cooling.

The three-step heat transfer and cooling method of the first embodiment is shown in FIG. 1 and preferably includes the following steps:

1. transferring heat from, for instance, a CPU heat sink 16 through heat pipes 14 to primary heat storage mediums 12, which are preferably manufactured from aluminum, copper and/or other heat transferring materials;
2. transferring heat from the primary heat storage mediums 12 to secondary heat storage mediums 18; and
3. transferring heat from the secondary heat storage mediums 18 to a rear-mounted heat exchanger 20 through heat pipes 23, and then cooling by one or more fans 22. The heat could also be transferred from the secondary heat storage mediums 18 to a fan 22, water chiller, and/or liquid coolant for cooling, such as can be provided by an external water pipe connector 38.

Preferably, there are heat and/or water pipes 23 embedded within the secondary heat storage mediums 18. These pipes are exceptional mediums for the transfer of heat. The secondary heat storage mediums 18 are not preferably directly attached to the heat exchanger 20, as shown in FIG. 1, but are preferably connected thereto through a series of heat or water pipes 23.

Figure 2A:
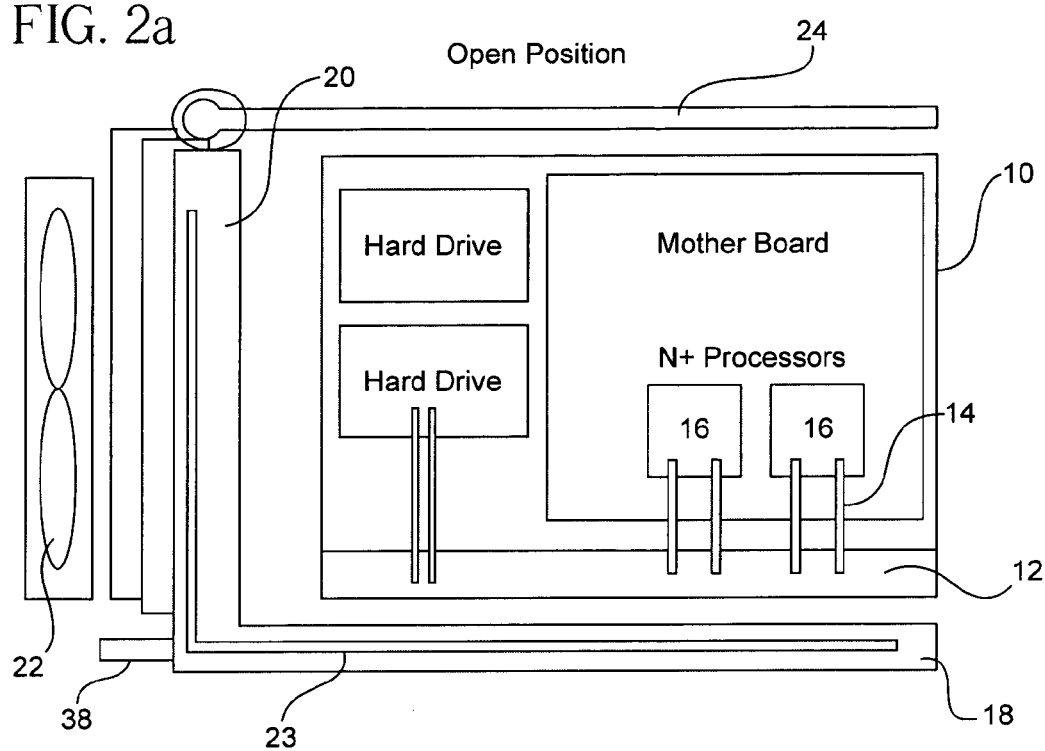
FIGS. 2a and 2b are side views of the apparatus shown in FIG. 1 illustrating a push down bar in an unlocked and locked position, respectively.
Figure 2B:
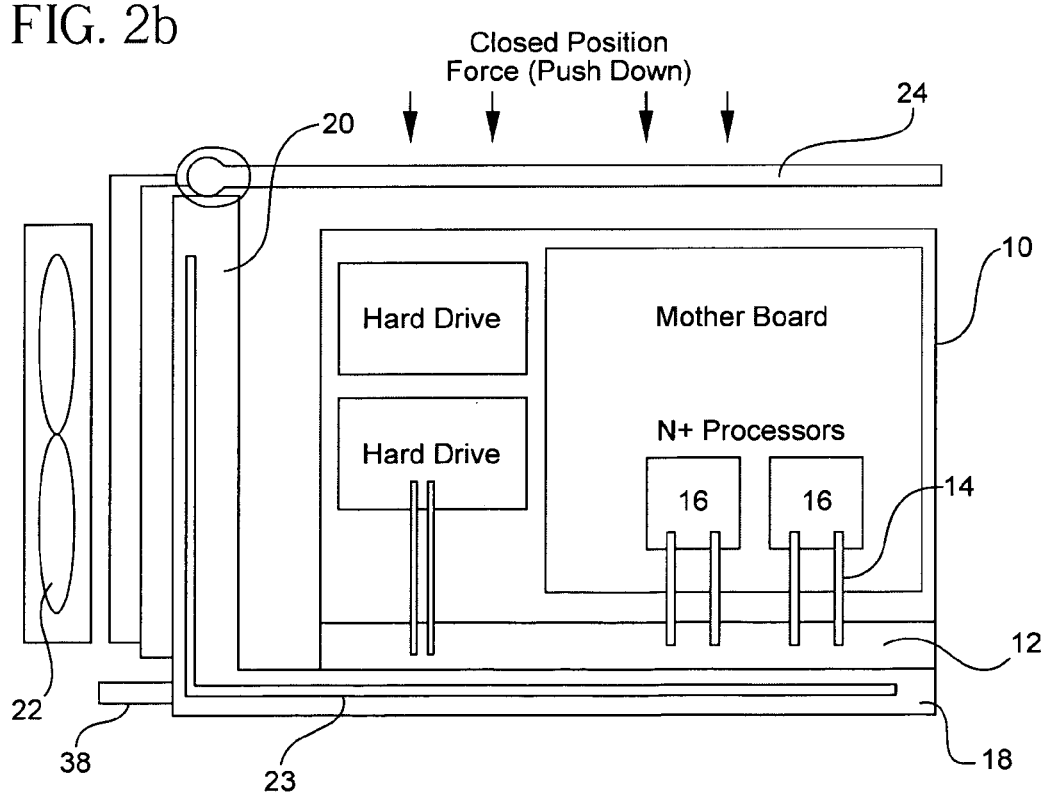

As shown in FIGS. 1, 2a, and 2b, a push down bar 24 is preferably utilized in accordance with the present invention. The bar 24 presses down or exerts force on the blade server 10 and its primary heat storage mediums 12 against the secondary heat storage mediums 18 to ensure proper contact and transfer of heat therebetween.

Figure 6A:
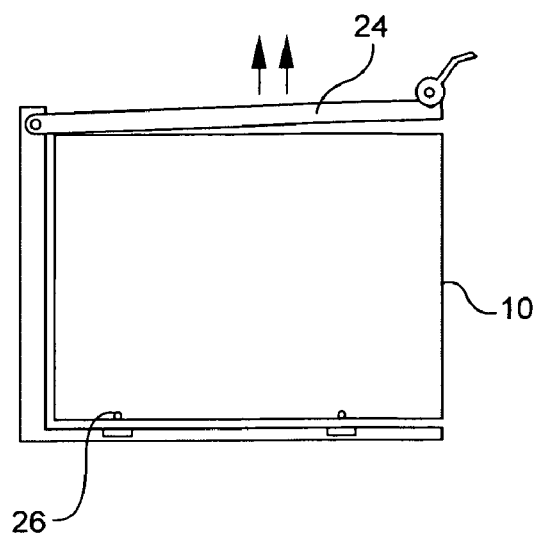
FIGS. 6a and 6b are side views of the apparatus shown in FIG. 1 in the unlocked and locked position, respectively.
Figure 6B:
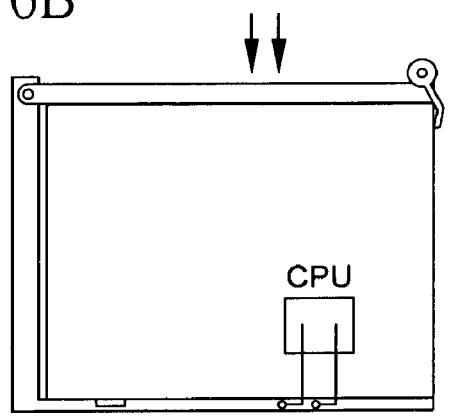
Figure 7A:
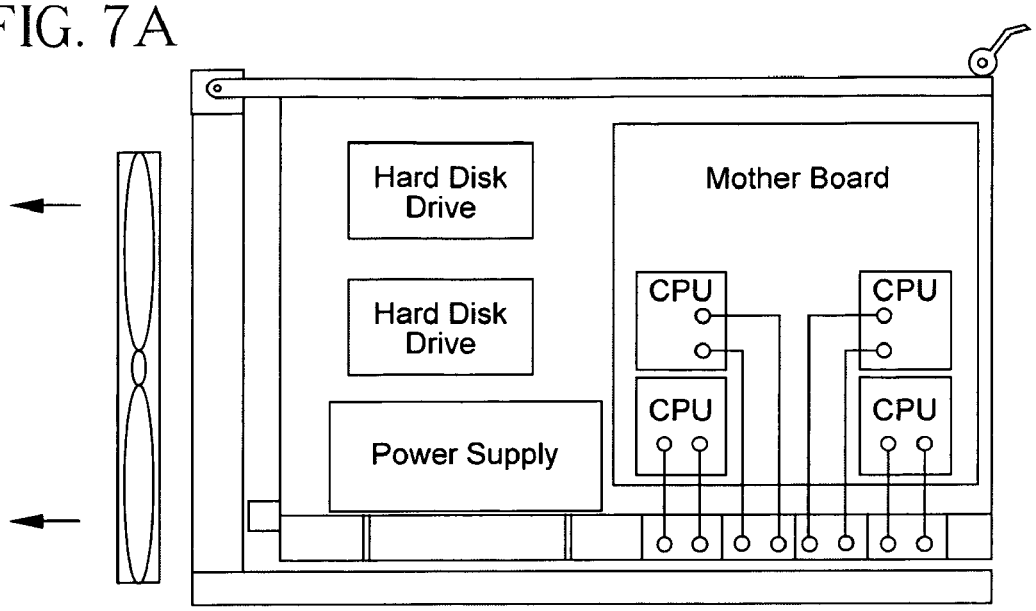
FIGS. 7a, 7b, and 7c are side, rear, and rear perspective views of the apparatus shown in FIG. 1.
Figure 7B:
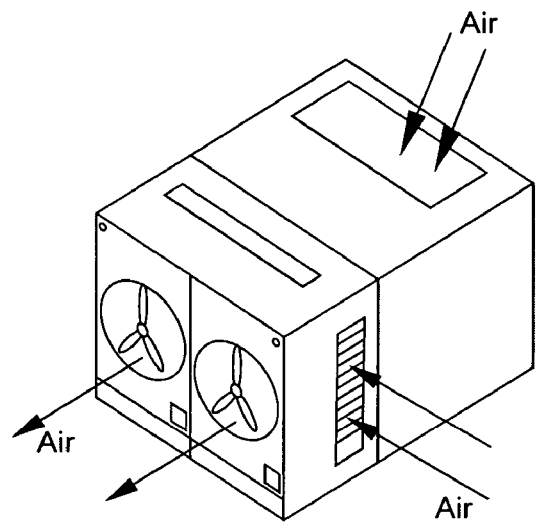
Figure 7C:
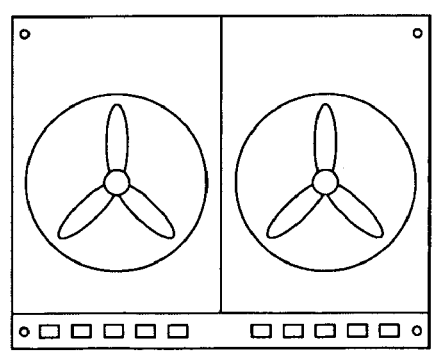
Figure 8:
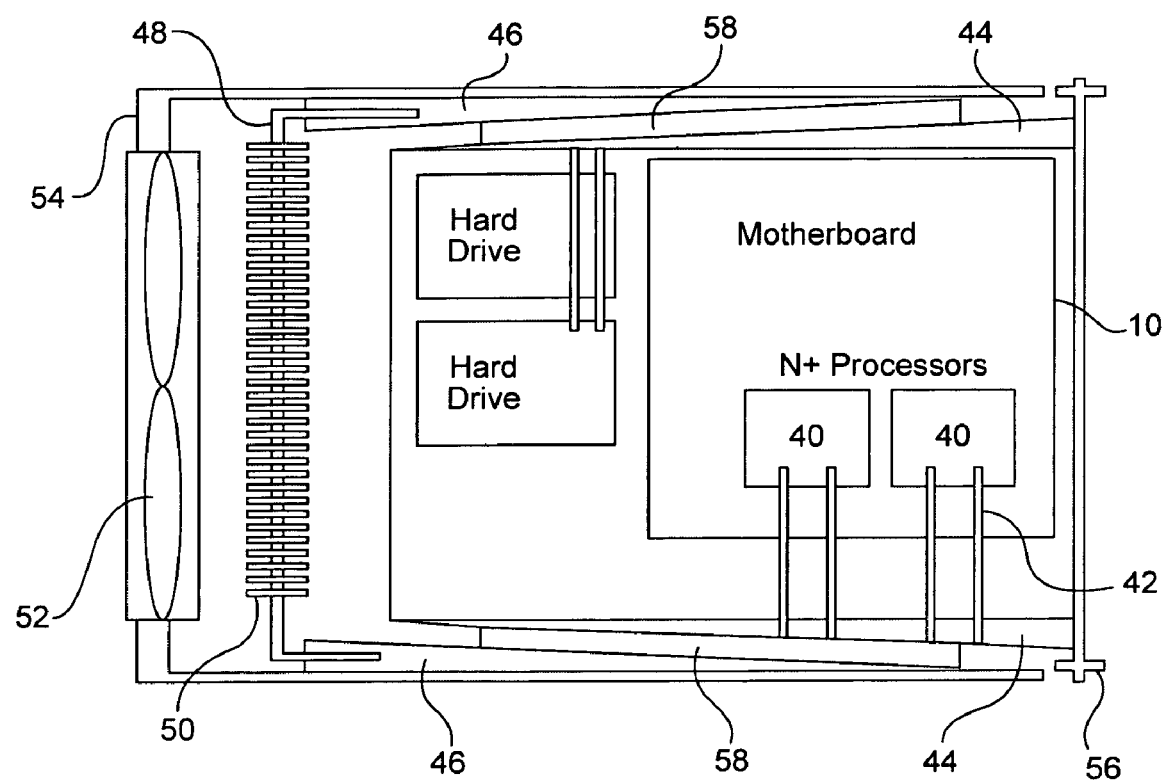
FIG. 8 is a side view of a second embodiment of an apparatus for cooling a blade server.
Figure 9:
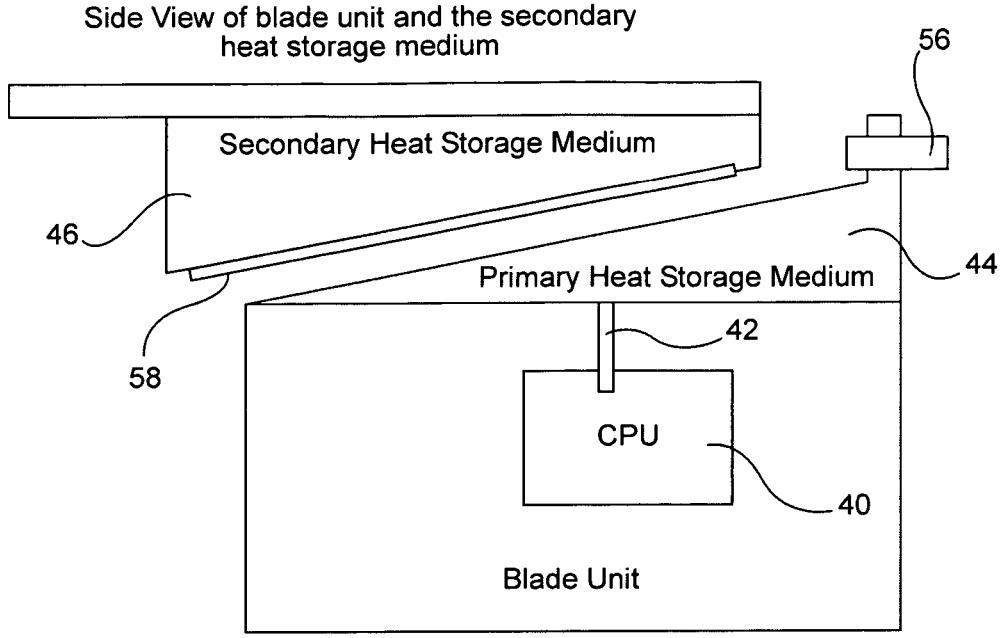
FIGS. 9 and 10 are simplified side views of the apparatus shown in FIG. 8 in a disengaged and engaged position, respectively.

When the bar is in an unlocked position, as shown in FIGS. 2a, 6a, and 7a, the blade server can easily be removed from and inserted into its housing or enclosure. However, when the bar is in a locked position, as shown in FIGS. 2b and 6b, the blade server's primary heat storage mediums 12 are pressed down and firmly in contact with the secondary heat storage mediums 18. The amount of heat being transferred between the two mediums 12, 18 depends on the amount of force exerted on the primary heat storage mediums 12 as they are directed into contact with the secondary heat storage mediums 18.

Figure 3A:
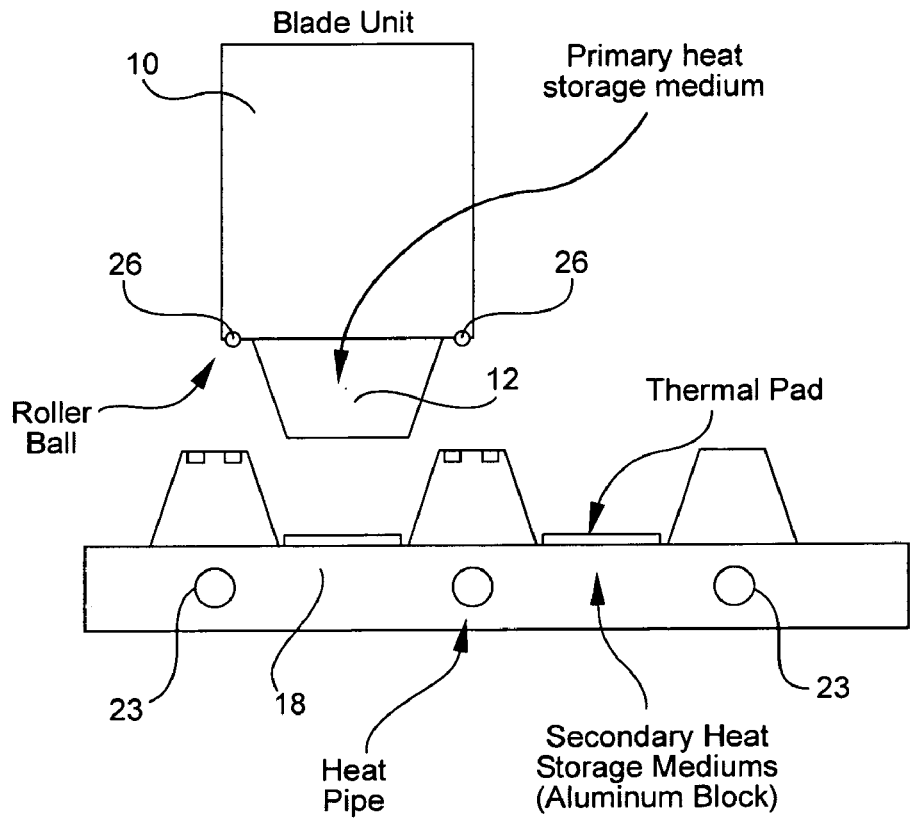
FIGS. 3a and 3b are front and side views of the apparatus shown in FIG. 1 in the unlocked and locked position, respectively.
Figure 3B:
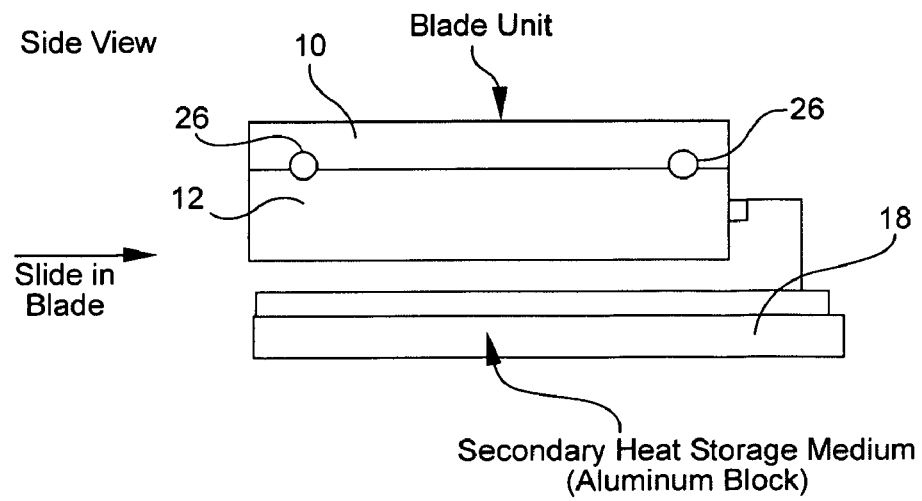

FIG. 3a shows a front view of the blade server 10 in the unlocked position with space between the primary heat storage medium 12 and the secondary heat storage medium 18. Roller balls 26 or ball bearings are preferably mounted on the blade server 10 to facilitate slidable insertion and removal of the blade server 10 into its enclosure while providing additional thermally conductive contacts. FIG. 3b shows a side view of the blade server including the roller balls 26.

Figure 4:
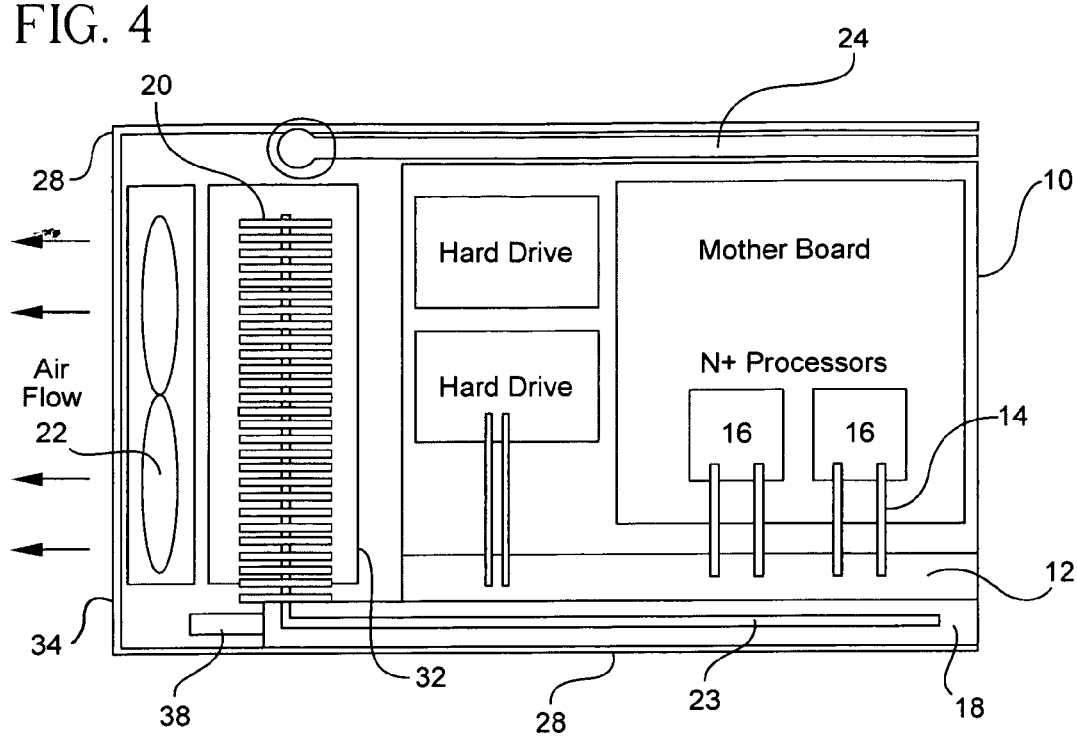
FIG. 4 is a side view of the apparatus shown in FIG. 1 illustrating the direction of airflow.

FIG. 4 shows a side view of an enclosure 28 or housing for the blade server 10. The housing 28 preferably includes an air chamber 30 between a fan 22 and blade server 10. Air is preferably drawn into the housing 28 from air intakes 32 and exhausted by the fan 22 from a rear face 34 of the housing 28.

Figure 5:
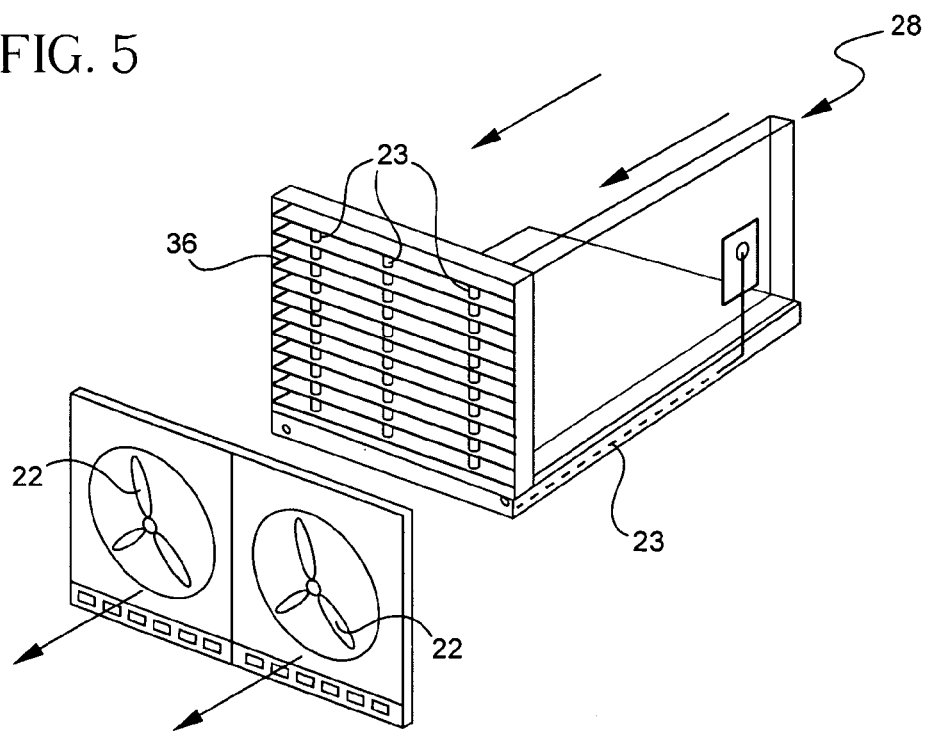
FIG. 5 is a rear perspective view of the apparatus shown in FIG. 1.
Figure 6C:
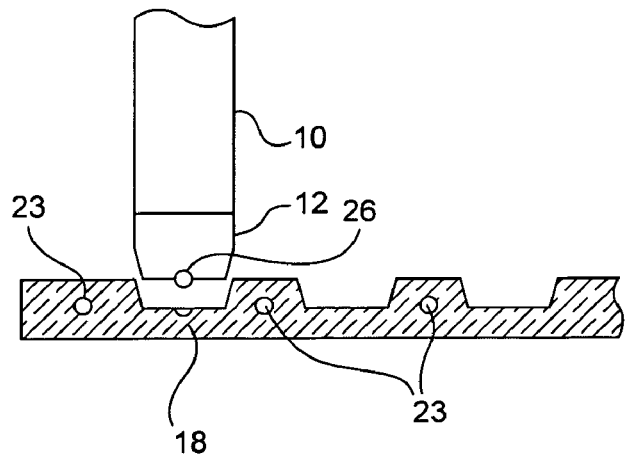
FIG. 6c is a front view of the apparatus shown in FIG. 1 in the unlocked position.

FIG. 5 is a rear perspective view of the housing 28, showing the heat pipes 23 in contact with cooling fins 36 at the rear of the housing 28. FIG. 6c shows an alternative placement of the roller balls 26 on the blade server 10.

Three additional preferred methods described herein that utilize a multi-step heat transfer cooling concept for blade server cooling are as follows:

1. Enclosure method;
2. Adjustable and Detachable Heatsink Method; and
3. Fixed-Shape Heatsink Method.

The enclosure method or second embodiment of the present invention utilizes a series of heat pipes and heat storage mediums (heat-conductivity plates) to draw heat energy away from electronic components to heat exchange units attached to the rear of a housing unit.

The first step in the second embodiment is transferring heat from heat sources to primary heat storage mediums through the series of heat pipes. The heat sources can be any heat generating devices, such as high-speed computer processors, hard disks, memory chips, or power supplies. The primary heat storage mediums can be any large blocks of aluminum, copper, or heat transferring materials in any shape, but preferably a rectangular shape.

The second step is transferring heat from the primary heat storage mediums to secondary heat storage mediums through direct surface contact. The surfaces of the mediums are preferably smooth and/or contain thermal transfer padding material for heat transfer to occur efficiently. The ability to separate and reattach the primary and secondary heat storage mediums is preferred in the second embodiment. This feature helps to maintain physical access to the blade servers and facilitates the quick removal and reattachment of blade servers to their housing unit.

The third step includes transferring heat from the secondary heat storage mediums to a heat exchanger, water chiller, and/or heat fins for further cooling.

The heat transfer path of the second embodiment using the enclosure method is shown in FIGS. 8-22, and is summarized as follows.

1. Heat is transferred from heat source 40 through heat pipes 42 to primary heat storage mediums (which is preferably an aluminum plate) 44, such as a rack-mountable housing surrounding the circuit card.

2. Next, heat is transferred from the primary heat storage mediums 44 to secondary heat storage mediums (which is also preferably an aluminum plate) 46.

3. Heat pipes 48 then transfer heat from the secondary heat storage mediums 46 to a rear-mounted heat exchanger 50 and are cooled by fans 52 attached to a housing unit 54. The heat could also be transferred from the secondary heat storage mediums 46 to a water chiller for cooling through an external piping system.

Heat or water pipes 48 are preferably embedded within the secondary heat storage mediums 46. These heat or water pipes are adapted for efficient heat transfer. The secondary heat storage mediums 46 are preferably not directly attached to the heat exchanger 50, but are connected through a series of heat or water pipes 48.

Figure 10:
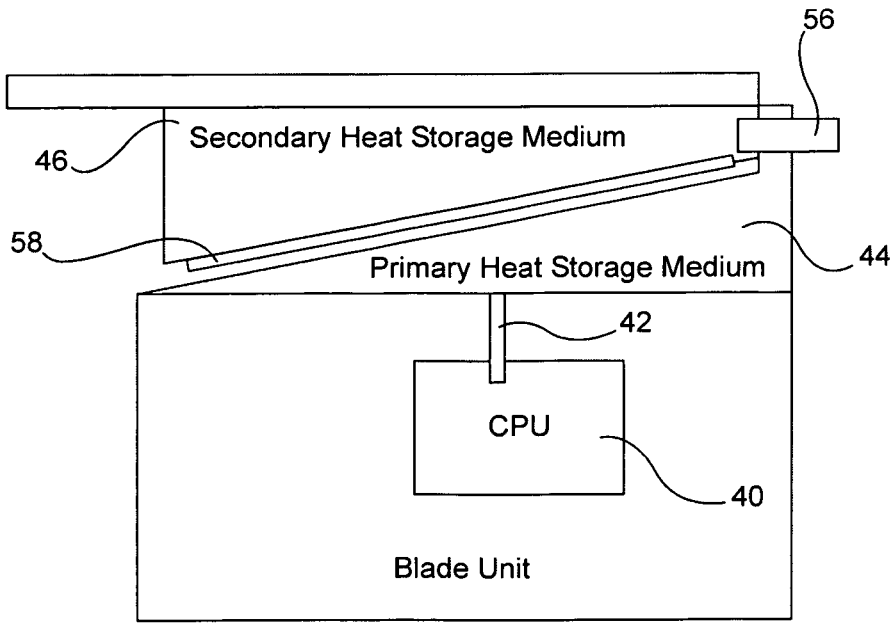
Figure 11:
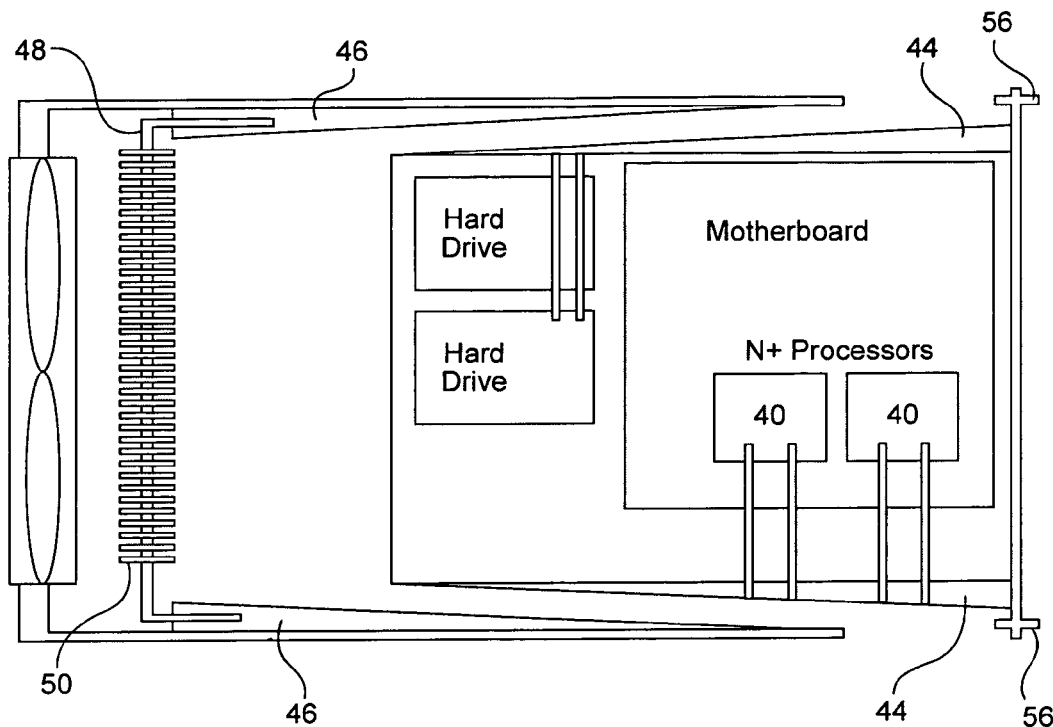
FIGS. 11 and 12 are side views of the apparatus shown in FIG. 8 in a disengaged and engaged position, respectively.
Figure 12:
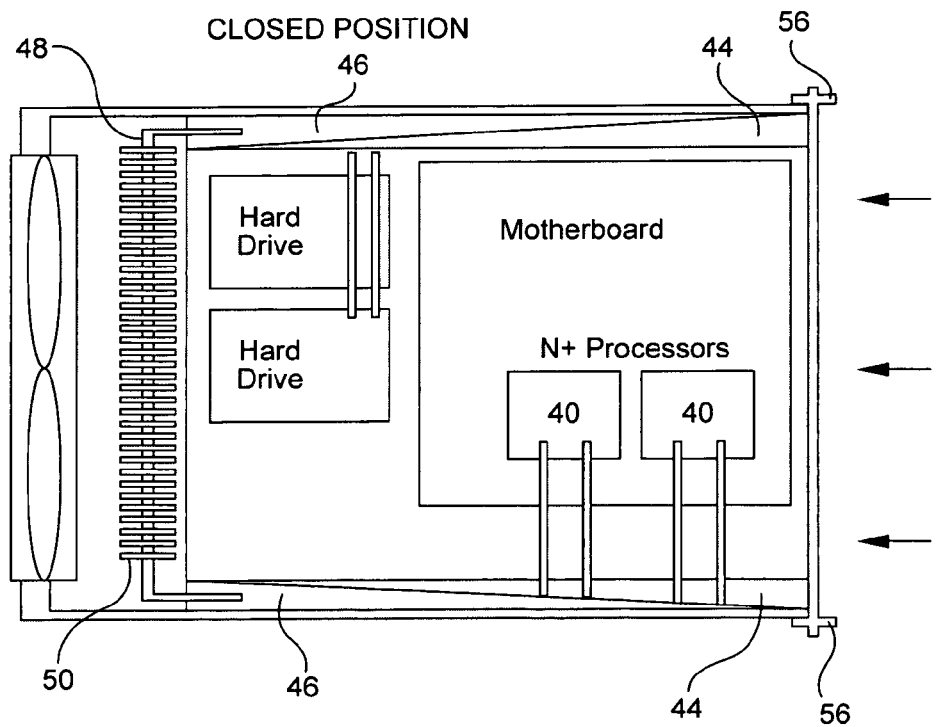
Figure 13:
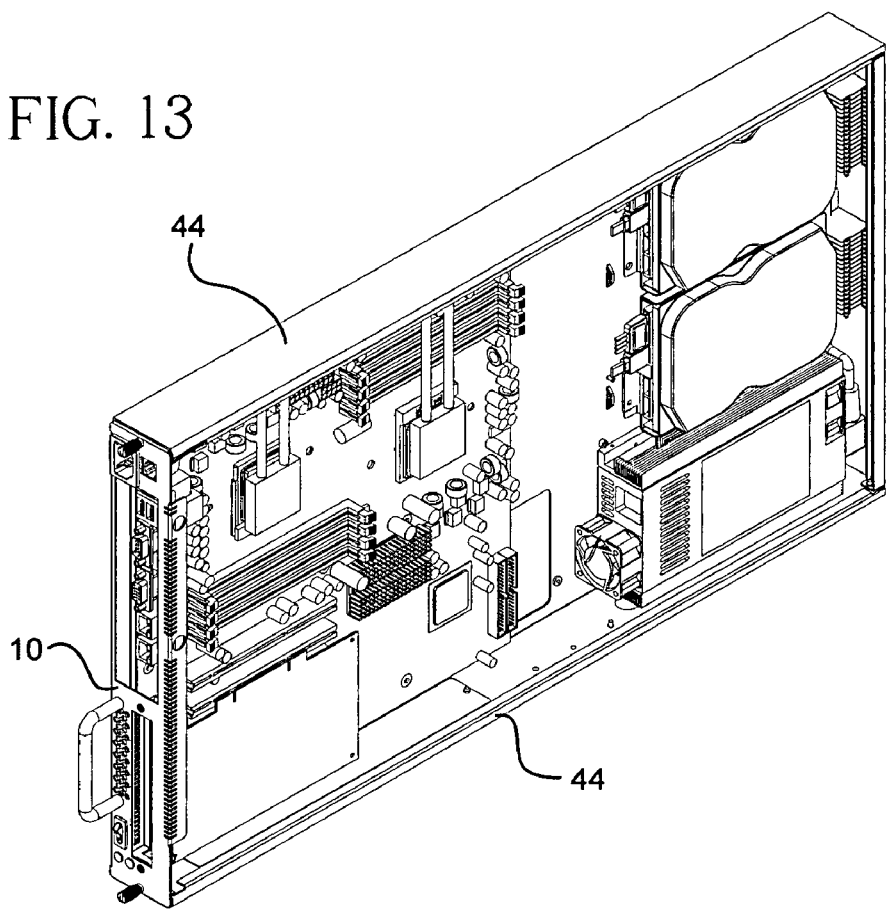
FIG. 13 is a perspective view of the apparatus shown in FIG. 8.

The heat storage mediums are preferably diagonally-shaped, ramped, or sloped as shown in FIGS. 8-12. When the blade unit 10 is inserted into the housing unit 54, the complementary slopes of the heat storage mediums 44, 46 preferably maximize the contacting surface area between the mediums 44, 46 as shown in FIG. 12. Heat energy will flow freely between the heat storage mediums as shown in FIG. 10. Two lock-down screws 56 preferably exert force on primary heat storage mediums 44 against the secondary heat storage mediums 46, to secure the primary heat storage medium in the housing unit 54 and against the secondary storage mediums 46 as shown in FIGS. 11 and 12. The amount of heat transferred between the two mediums depends on the amount of force exerted on the primary heat storage mediums 44 and against the secondary heat storage mediums 46. Thermal padding material 58 is also preferably applied between the heat storage mediums 44, 46 to further promote heat transfer.

Figure 14:
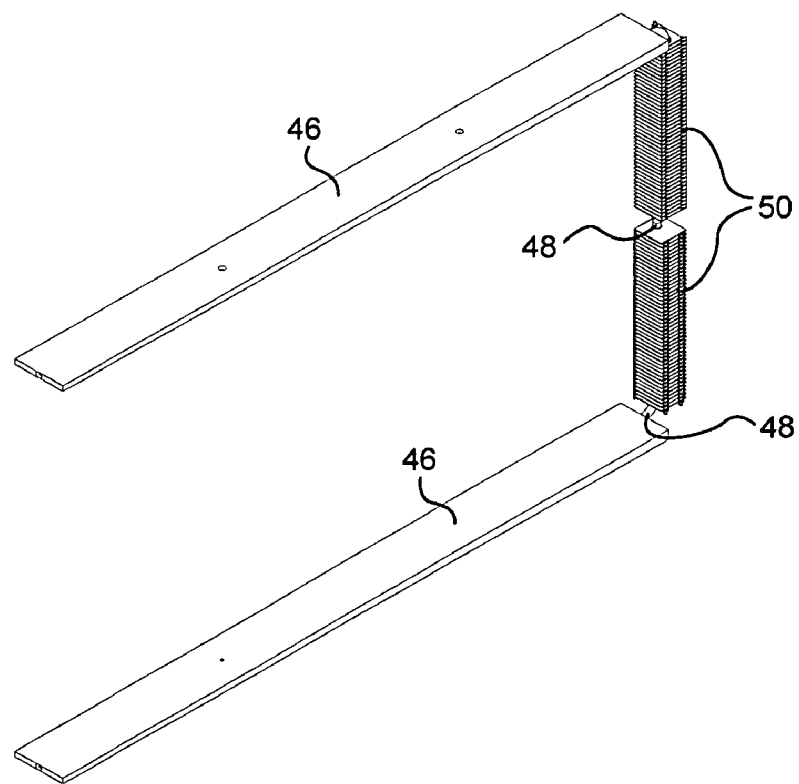
FIG. 14 is a perspective view of a portion of the apparatus shown in FIG. 8.
Figure 15:
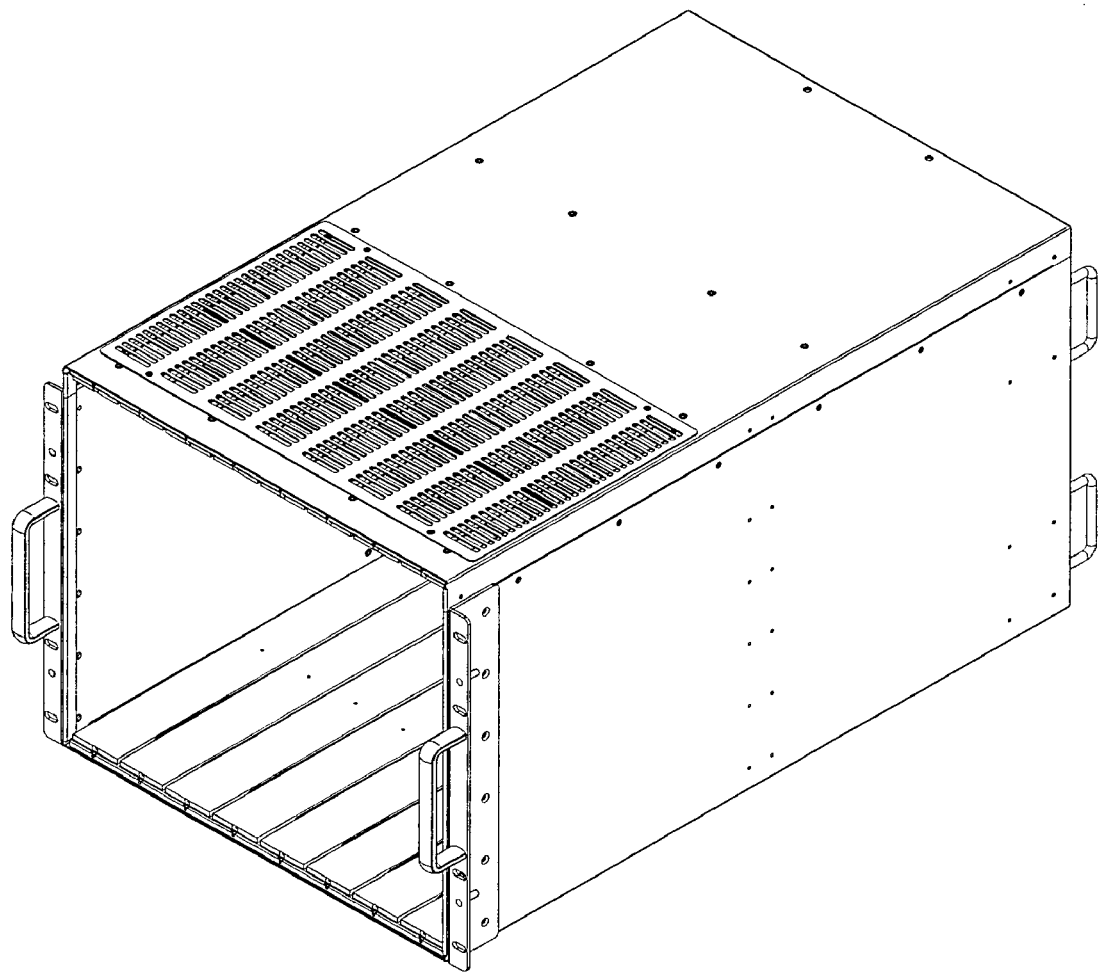
FIG. 15 is a perspective view of an enclosure used with the apparatus shown in FIG. 8.
Figure 16:
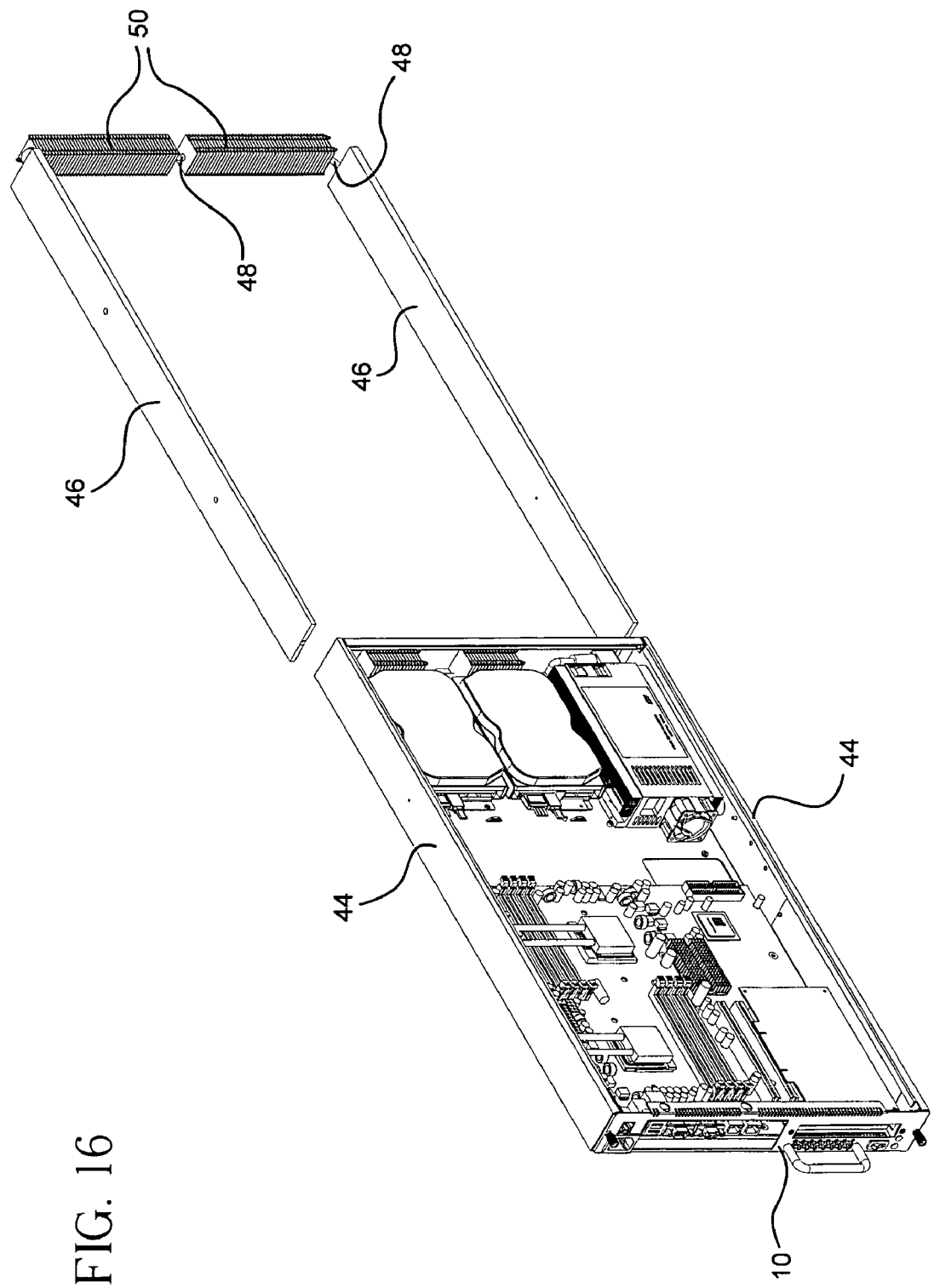
FIG. 16 is a pictorial view of the apparatus shown in FIG. 8.
Figure 17:
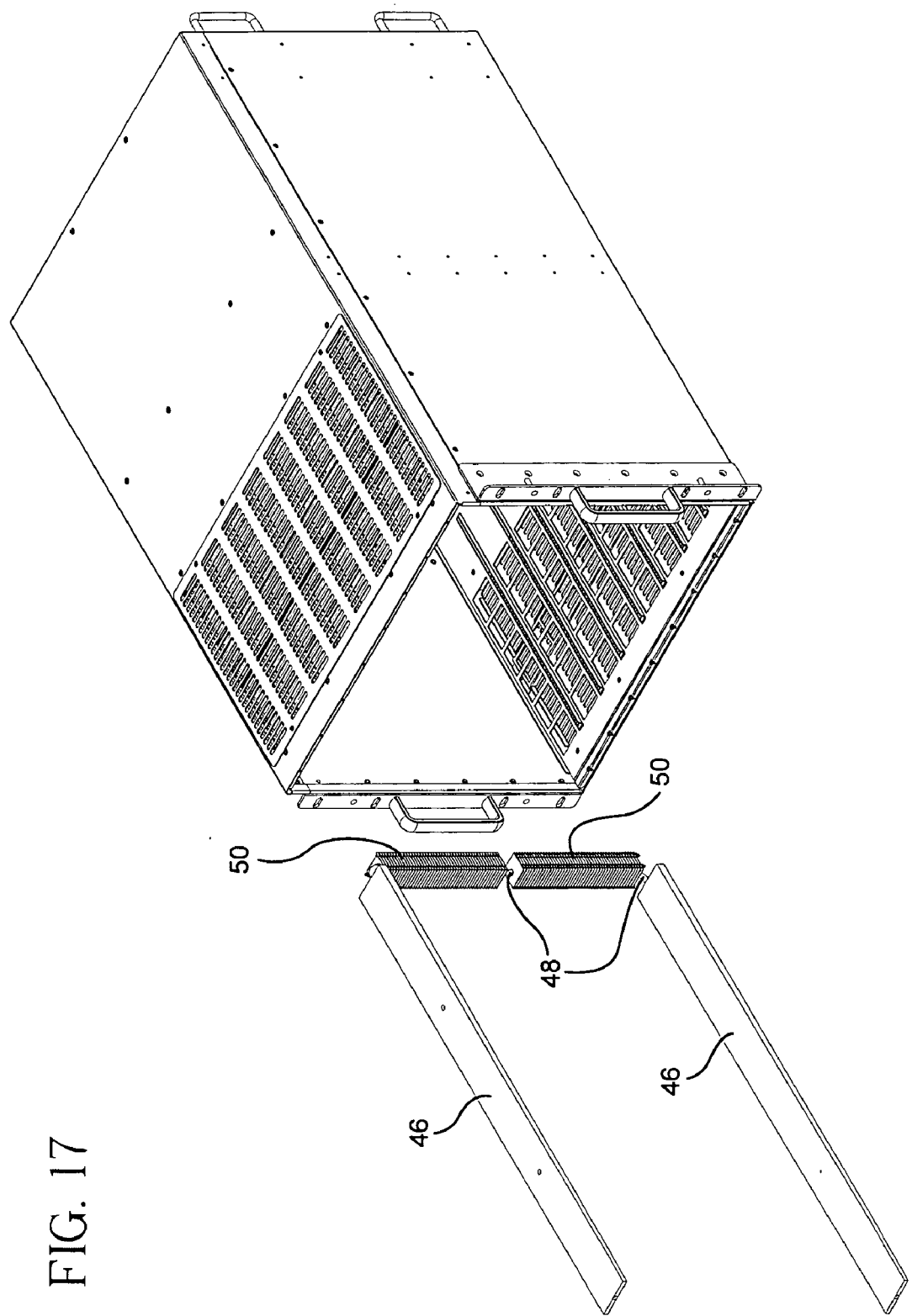
FIG. 17 is a pictorial view of a portion of the apparatus shown in FIG. 8 with an enclosure.
Figure 18:
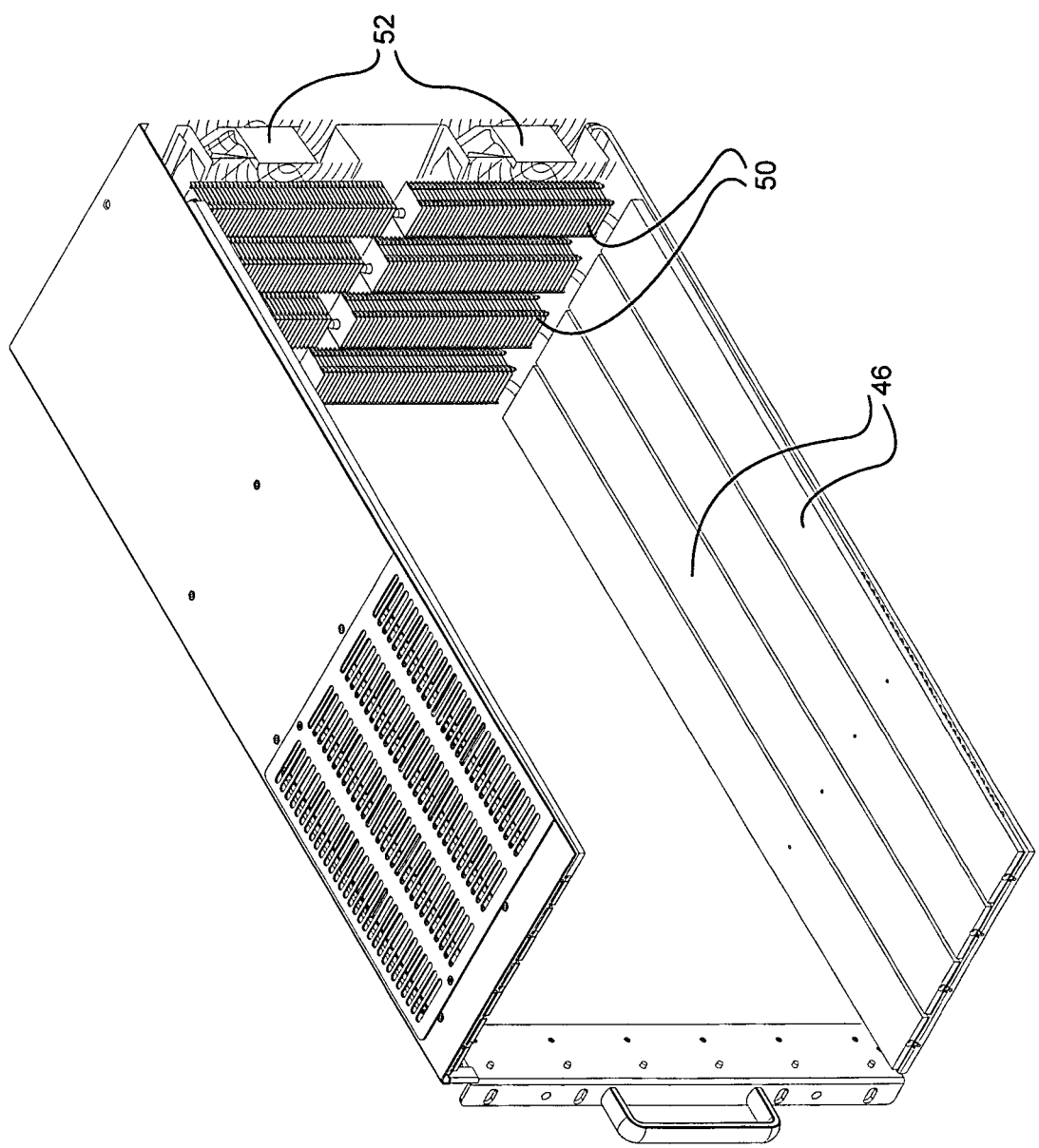
FIG. 18 is a cross-sectional pictorial view of the enclosure with a portion of the apparatus shown in FIG. 8.
Figure 19:
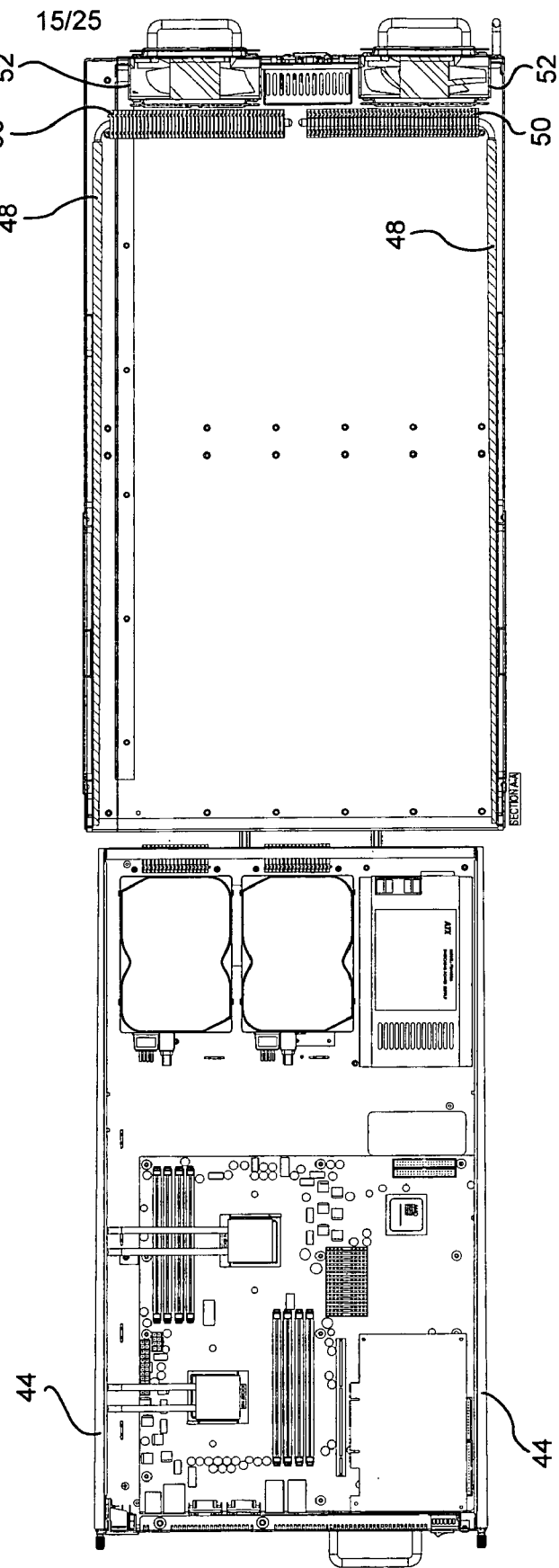
FIG. 19 is a side pictorial view of the apparatus in FIG. 8 with the enclosure.
Figure 20:
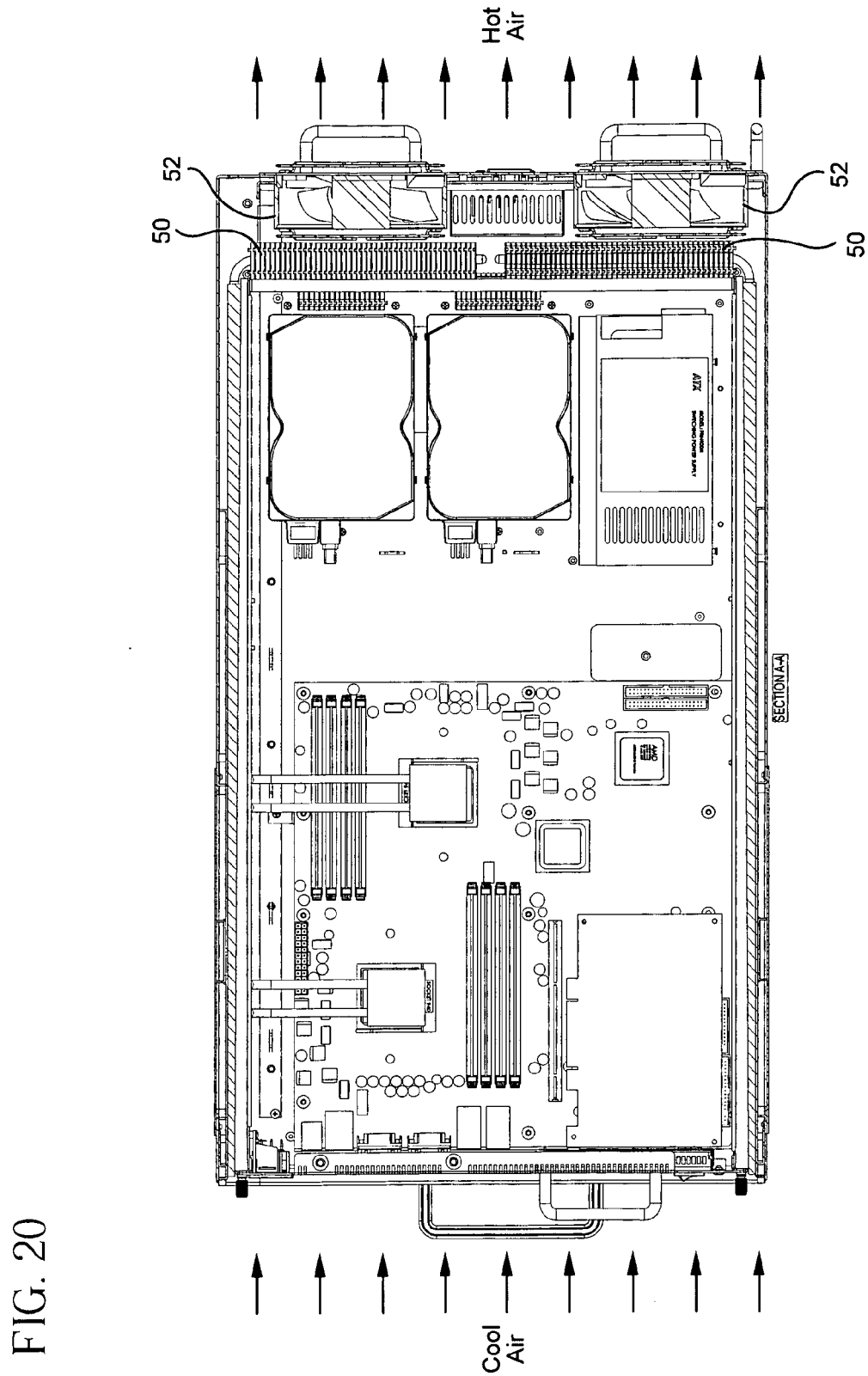
FIG. 20 is a side pictorial view of the apparatus shown in FIG. 8.

The heat exchanger 50 shown in FIG. 14 preferably includes an array of thin fins made of copper, aluminum, or any other heat conducting materials. Cool air is preferably drawn in from the front air-intake holes of the blade server shown in FIG. 20 and exits through the fans 52 located at the rear of the housing unit 54. As cool air passes through the heat exchanger 50, heat or hot air is exhausted out by the rear fans 52.

In order to make COTS (Commercial Off-the-Shelf) boards fit into slim enclosures, such as blade server enclosures, the supporting components, such as CPU heat sinks must be redesigned. A standard CPU heat sink built for a MicroATX board has a typical height of 2.5 inches, which will not fit into a blade enclosure with a typical height of 1.7 inches. By simply reducing the height of the heat sink to 1.7 inches, its cooling effectiveness is substantially reduced. In many cases, the heat sink simply does not work with such a modification. In addition, the placement of a CPU and heat sink on a typical MicroATX board often creates additional and substantial obstacles that block the normal airflow within a blade chassis. Thus, a cooling solution is needed to address these height and airflow issues. It is to be noted that the following design concepts can be applied to any heat generating components or heat sources within an enclosure, and are not limited to cooling CPUs (Central Processing Units).

The cooling method of a third embodiment using the adjustable and detachable heat sink method utilizes a series of heat pipes and adjustable heat storage mediums (heat-conductivity plates) to draw heat energy away from electronic components to a heat exchange unit. In addition, this method utilizes specific airflow alignment to achieve maximum cooling efficiency.

The first step in the multi-step concept of the third embodiment includes transferring heat from heat sources to primary heat storage mediums through a series of heat pipes. The heat sources can be any heat generating devices, such as high-speed computer processors, hard disks, memory chips, video graphic chips, video cards, video encoder/decoder boards, or power supplies. The primary heat storage mediums can be any large blocks of aluminum, copper, or heat transferring materials in any shape, but preferably a rectangular shape. The primary heat storage mediums may contain fins to help further cooling at the heat sources.

The second step includes transferring heat from the primary heat storage mediums to the secondary heat storage mediums through direct surface contact. The surfaces of the mediums are preferably smooth and/or contain thermal transfer padding material for heat transfer to occur efficiently. The ability to separate and reattach the primary and secondary heat storage mediums is preferred in this embodiment to provide a heat transfer device that is adjustable and reconfigurable. The separation and reattachment of the primary and secondary heat storage mediums makes it possible for the heat transfer device to extend the length of the associated heat pipes or shift the location of the heat exchanger to improve its alignment with the flow of cool air.

The third step includes transferring heat from the secondary heat storage mediums to a heat exchanger, water chiller, and/or heat fins.

Any of the cooling concepts described herein may employ multiple primary and secondary heat mediums to form an elaborate heat transfer and piping network to achieve maximum cooling efficiency.

Figure 23:
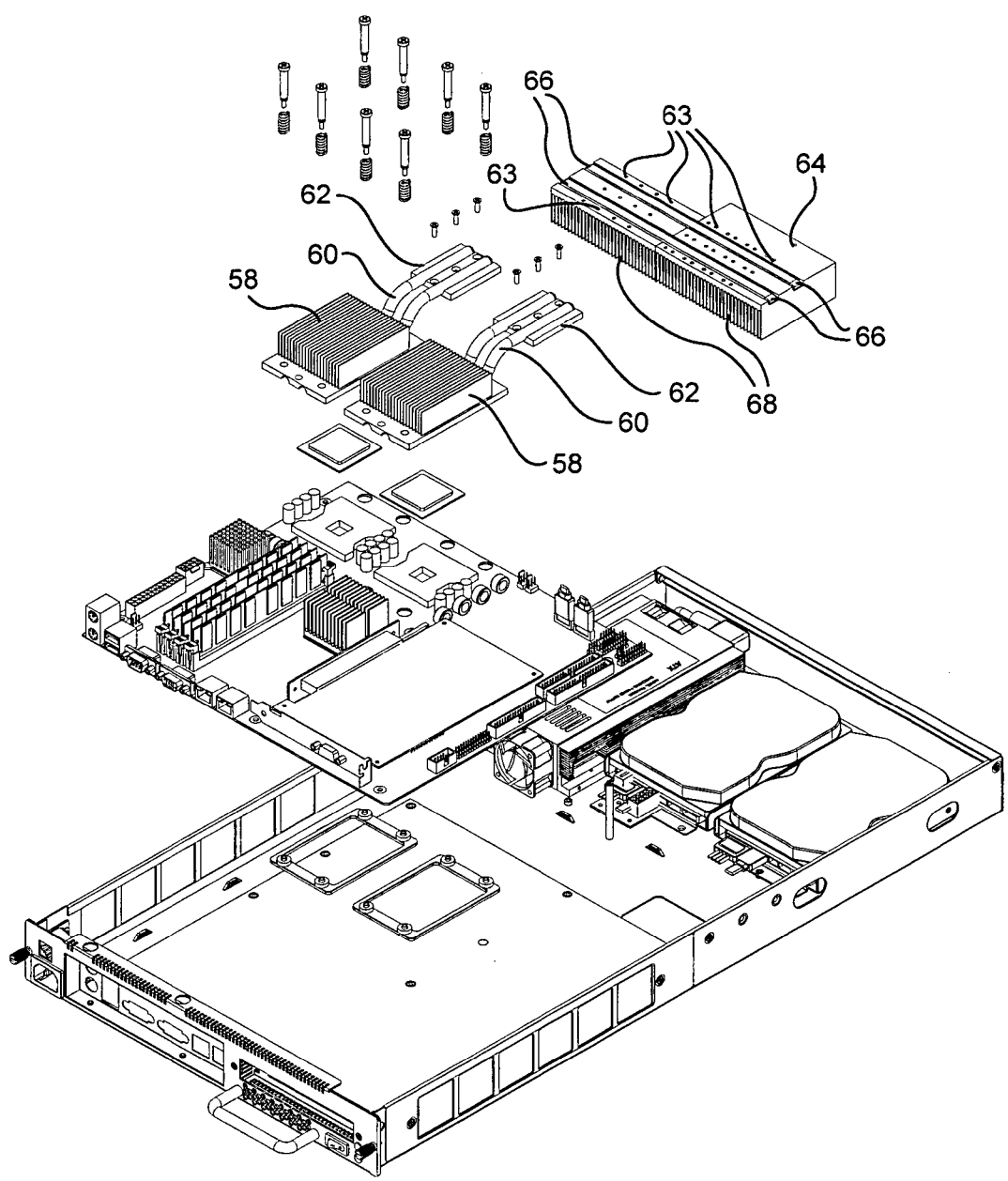
FIG. 23 is an exploded view of a third embodiment of an apparatus for cooling a blade adapted for multiple adapted for multiple heat sources.
Figure 24:
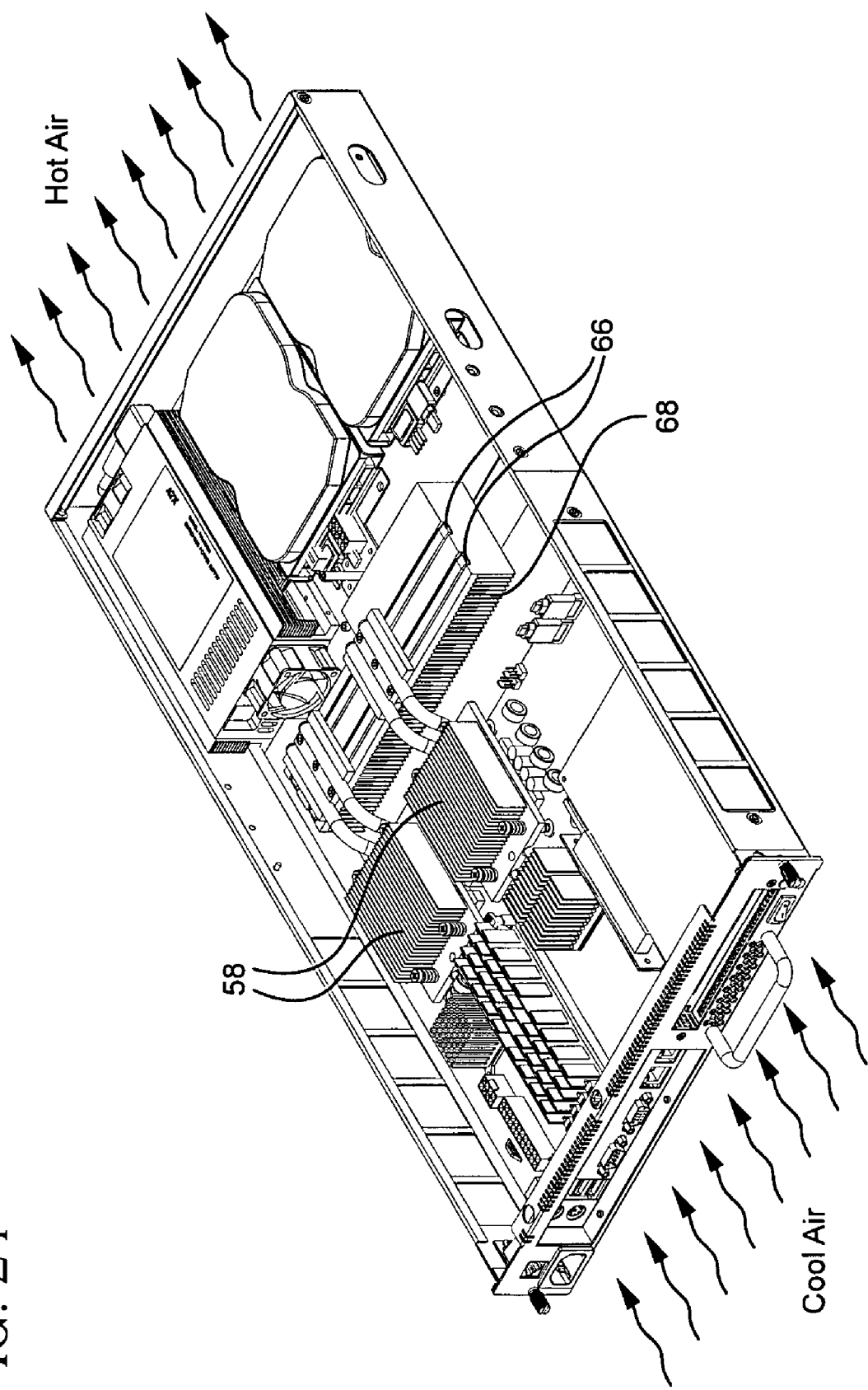
FIG. 24 is a perspective view of an apparatus for cooling a blade adapted for multiple adapted for a single heat source.

The heat transfer path of the adjustable and detachable heat sink method, adapted for multiple-heat sources is shown in FIGS. 23 and 24, and is summarized as follows.

1. Heat is first transferred from heat sources to heat sinks 58.
2. Next, heat is transferred from heat sinks 58 through heat pipes 60 to primary heat storage mediums (which preferably include an aluminum or copper plate) 62.
3. Next, the heat is transferred from the primary heat storage mediums 62 to secondary heat storage mediums (which preferably includes an aluminum or copper plate) 64 preferably located over the blade server or printed circuit board.
4. Heat pipes 66 preferably transfer heat from the secondary heat storage mediums 64 to a series of heat dissipating fins 68, or heat exchanger, preferably located over the blade server or printed circuit board.
5. The heat dissipating fins 68 are preferably cooled by the cool air passing through the enclosure, as shown in FIG. 24, from the front to the rear of the enclosure.

Figure 21:
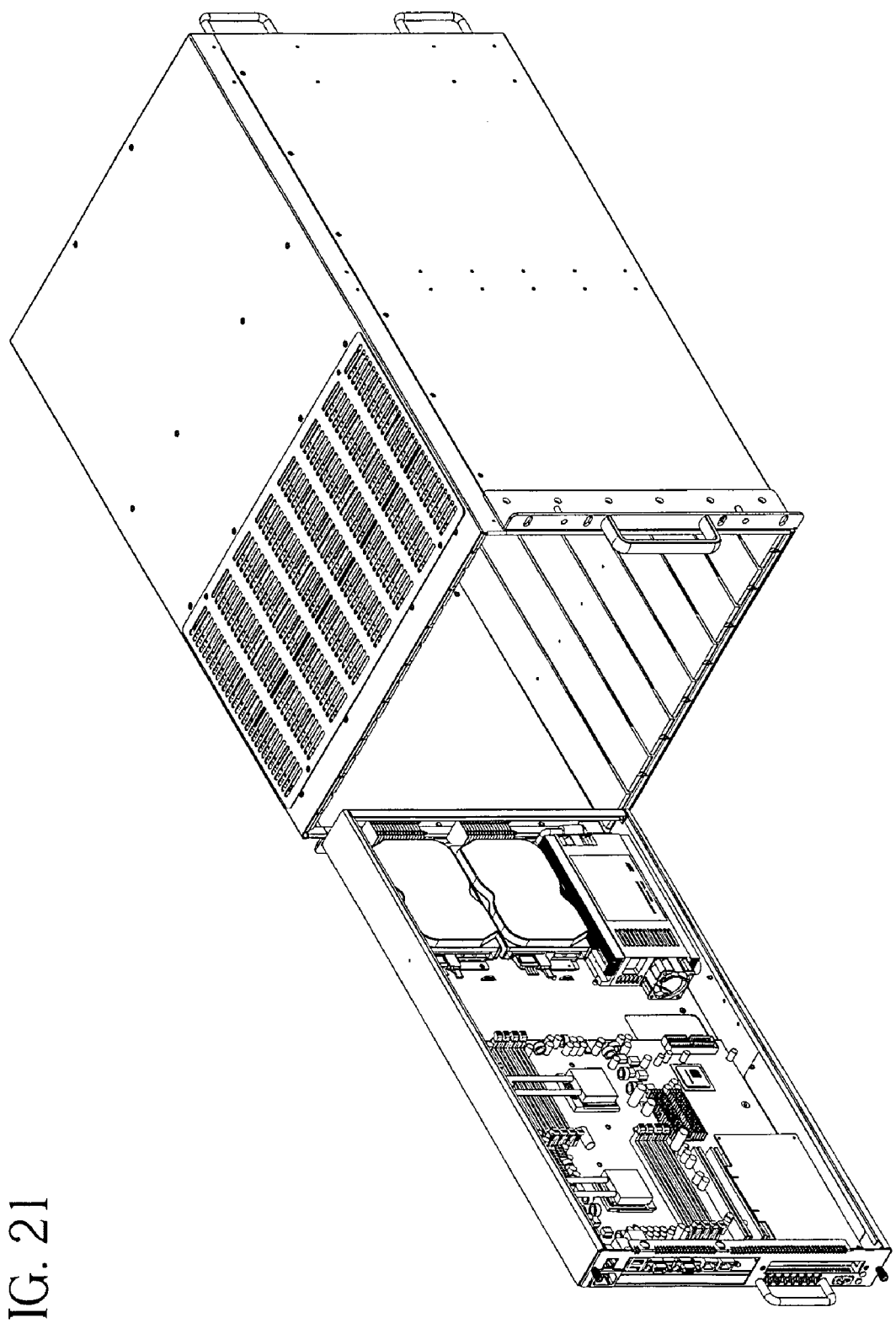
FIG. 21 is a side pictorial view of the apparatus in FIG. 8 with the enclosure.
Figure 22:
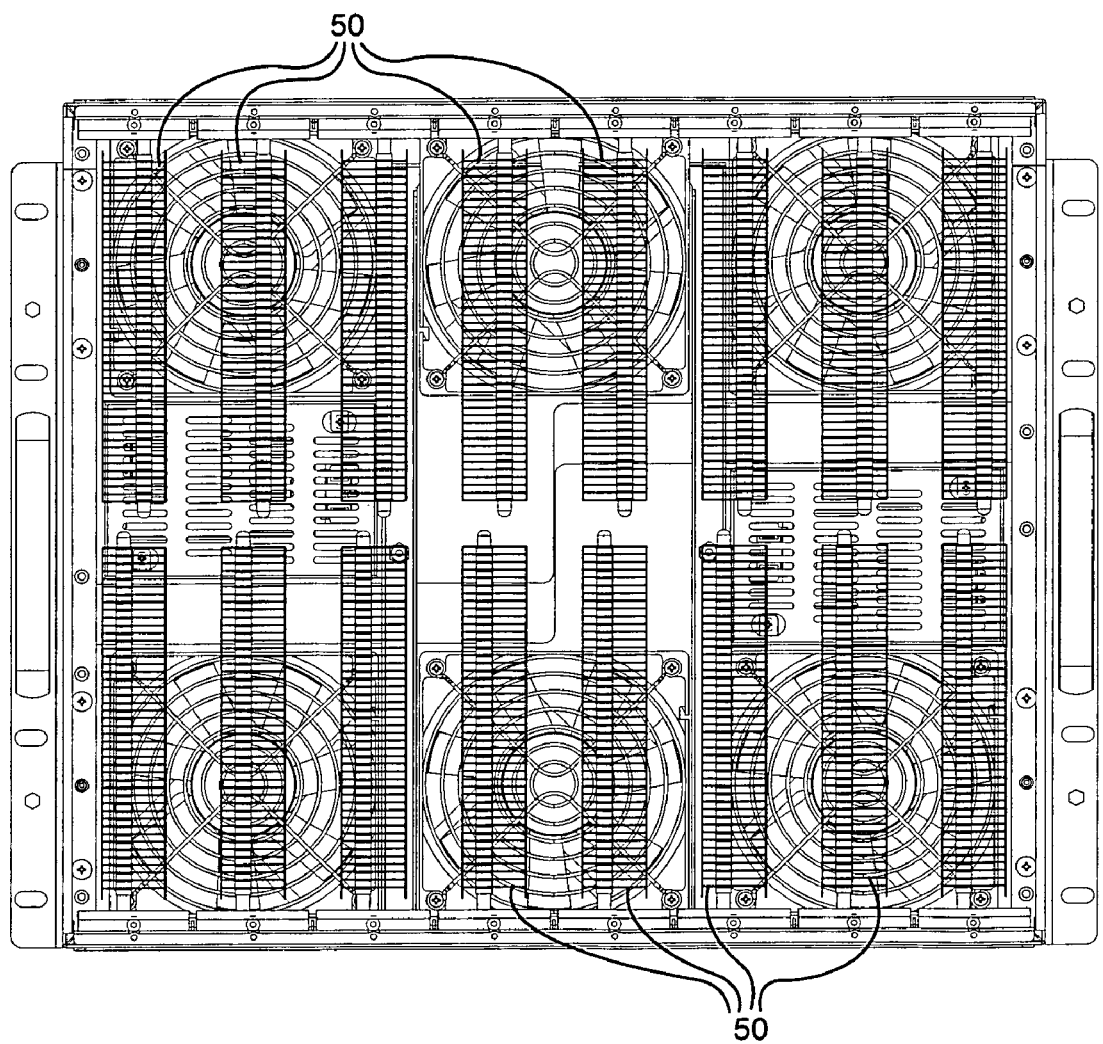
FIG. 22 is a rear pictorial view of the enclosure shown in FIGS. 20 and 21.

The enclosure incorporating the adjustable and detachable heat sink method of the third embodiment is preferably inserted into a housing unit for cooling, as shown in FIG. 21.

Figure 25:
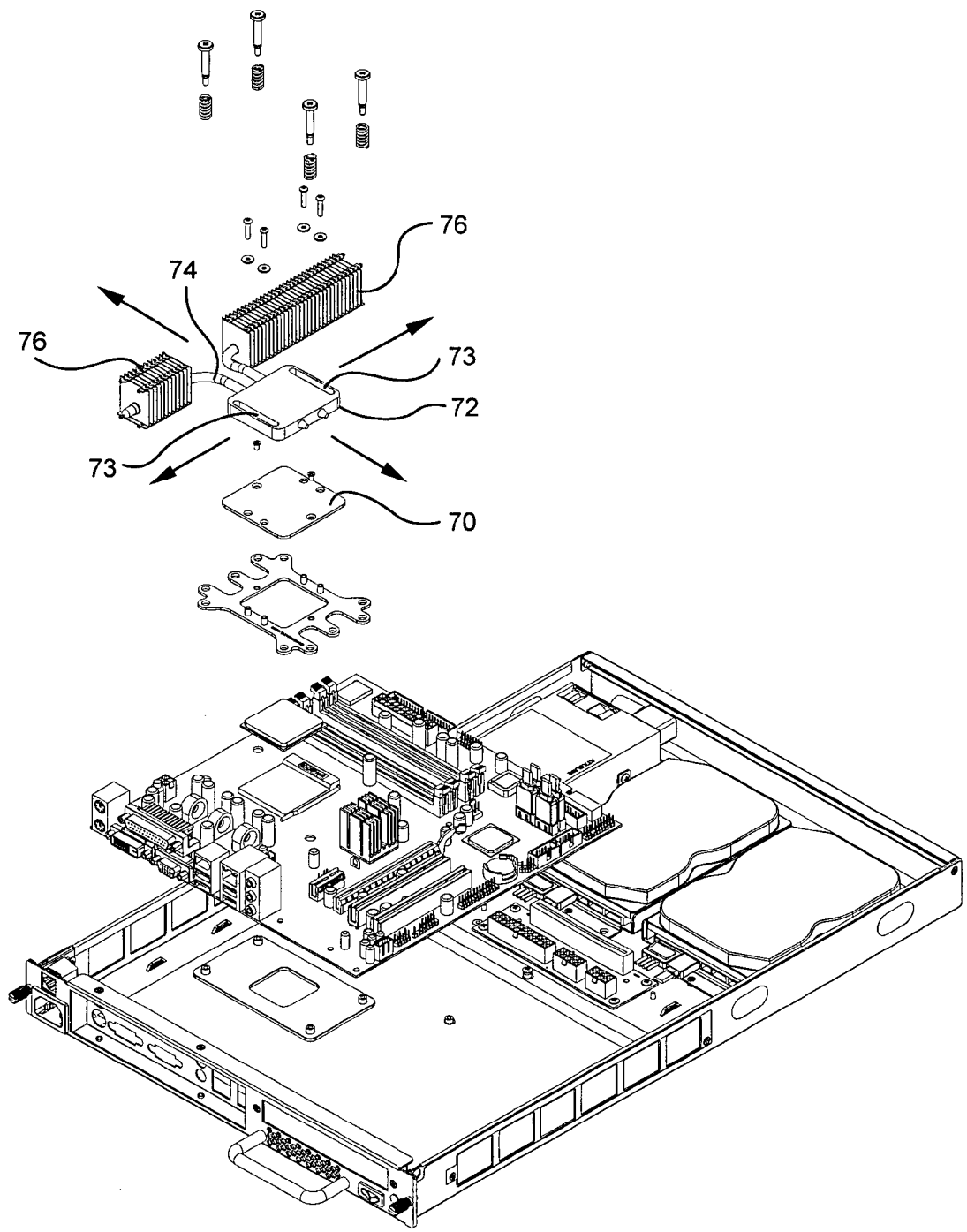
FIG. 25 is an exploded view of the third embodiment of an apparatus for cooling a blade server adapted for a single heat source.
Figure 26:
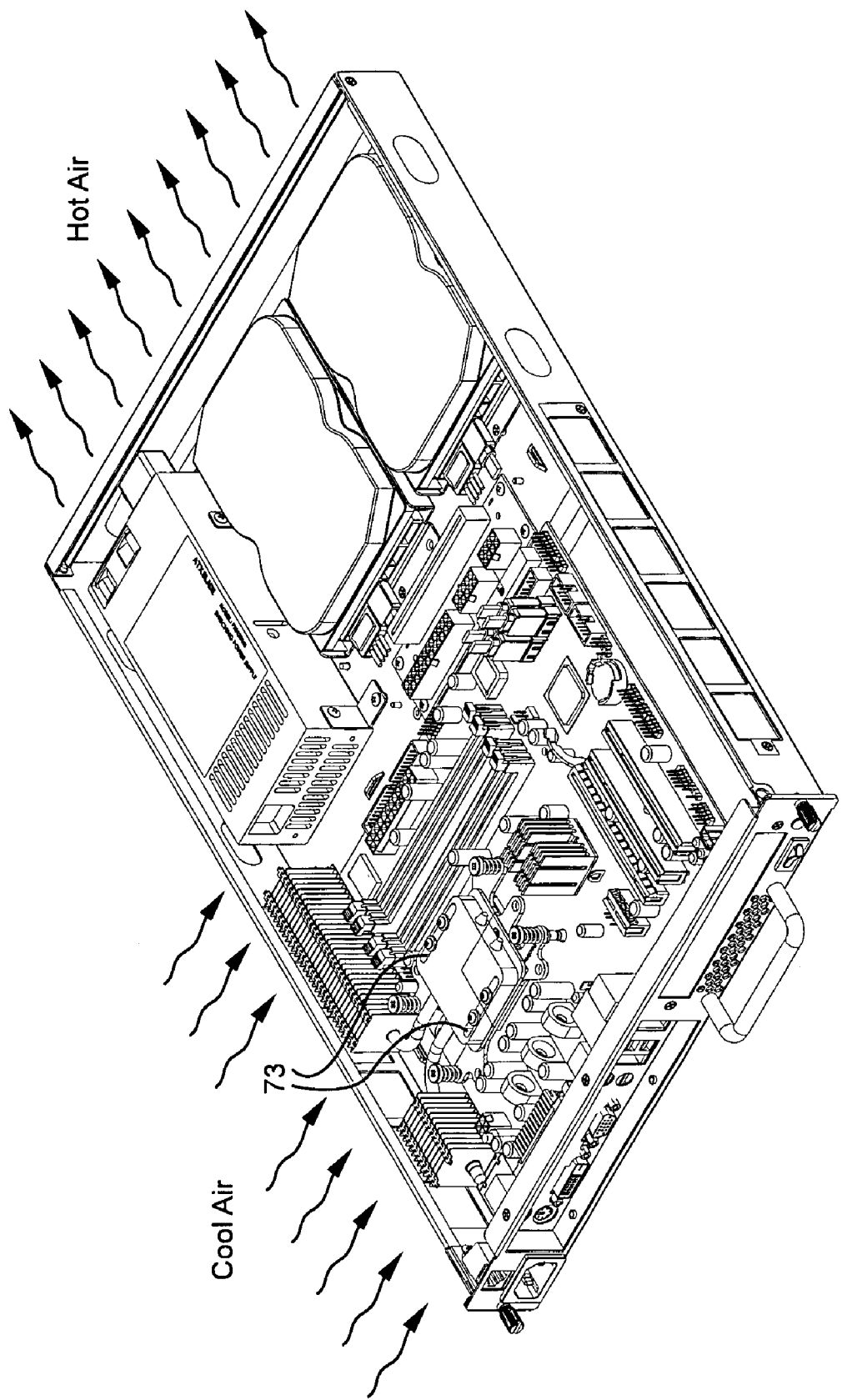
FIG. 26 is a perspective view of the third embodiment of an apparatus for cooling a blade server adapted for a single heat source.

The heat transfer path of the adjustable and detachable heat sink method, adapted for a single heat source is shown in FIGS. 25 and 26, and is summarized as follows.

1. Heat is transferred from a heat source to primary heat storage medium 70.
2. Next, the heat is transferred from the primary heat storage medium 70 to secondary heat storage medium (which preferably includes an aluminum or copper plate) 72 preferably located over the blade server or printed circuit board.
3. Heat pipes 74 transfer heat from the secondary heat storage mediums 72 to a series of heat dissipating fins 76, or heat exchanger, preferably located over the blade server or printed circuit board.
4. The heat dissipating fins 76 are preferably cooled by cool air passing through the enclosure, as shown in FIG. 26, from the side air-intake openings and exiting through the rear of the enclosure.

The enclosure incorporating the adjustable and detachable heat sink design of the third embodiment is preferably inserted into a housing unit for cooling, as shown in FIG. 21.

As shown in FIG. 23, the heat sink 58 is preferably detachable between primary heat storage medium 62 and secondary heat storage medium 64 via six screws. This feature allows the secondary heat storage medium 64 to assume different positions with respect to the primary heat storage medium 62 by attaching the primary heat storage mediums 62 to different sets of screw holes 63 along the secondary heat storage medium 64. This is a very important feature in controlling the paths of airflow within an enclosure and facilitates an adjustable alignment of the heat dissipating fins 68 with the flow of cool air to optimize cooling.

As shown in FIG. 25, the heat sink is detachable between primary heat storage medium 70 and secondary heat storage medium 72 via four screws. This feature also allows the secondary heat storage medium 72 to assume different positions with respect to the primary heat storage medium 70 by using slots 73 in the secondary heat storage medium 72 through which the screws are positioned into their respective receiving holes. It is to be understood that various slots, sets of differently positioned screw holes, and the like may be used to facilitate positional adjustability between the various components in each of the embodiments while remaining within the scope of the present invention. The shifting of secondary heat storage medium 72 results in the shifting of heat dissipating fins 76. The shifting of heat dissipating fins 76 effectively controls the flow of cool air entering the enclosure and the efficiency of cooling, as shown in FIG. 26.

The cooling method of a fourth embodiment using the fixed-shape heat sink method utilizes heat pipes and fixed-shape heat storage mediums (heat-conductivity plates) to draw heat energy away from electronic components to heat dissipating fins or heat exchangers. The method preferably utilizes parallel alignment of the heat dissipating fins, or heat exchangers, with respect to the cool airflow path in order to achieve maximum cooling efficiency.

Figure 27:
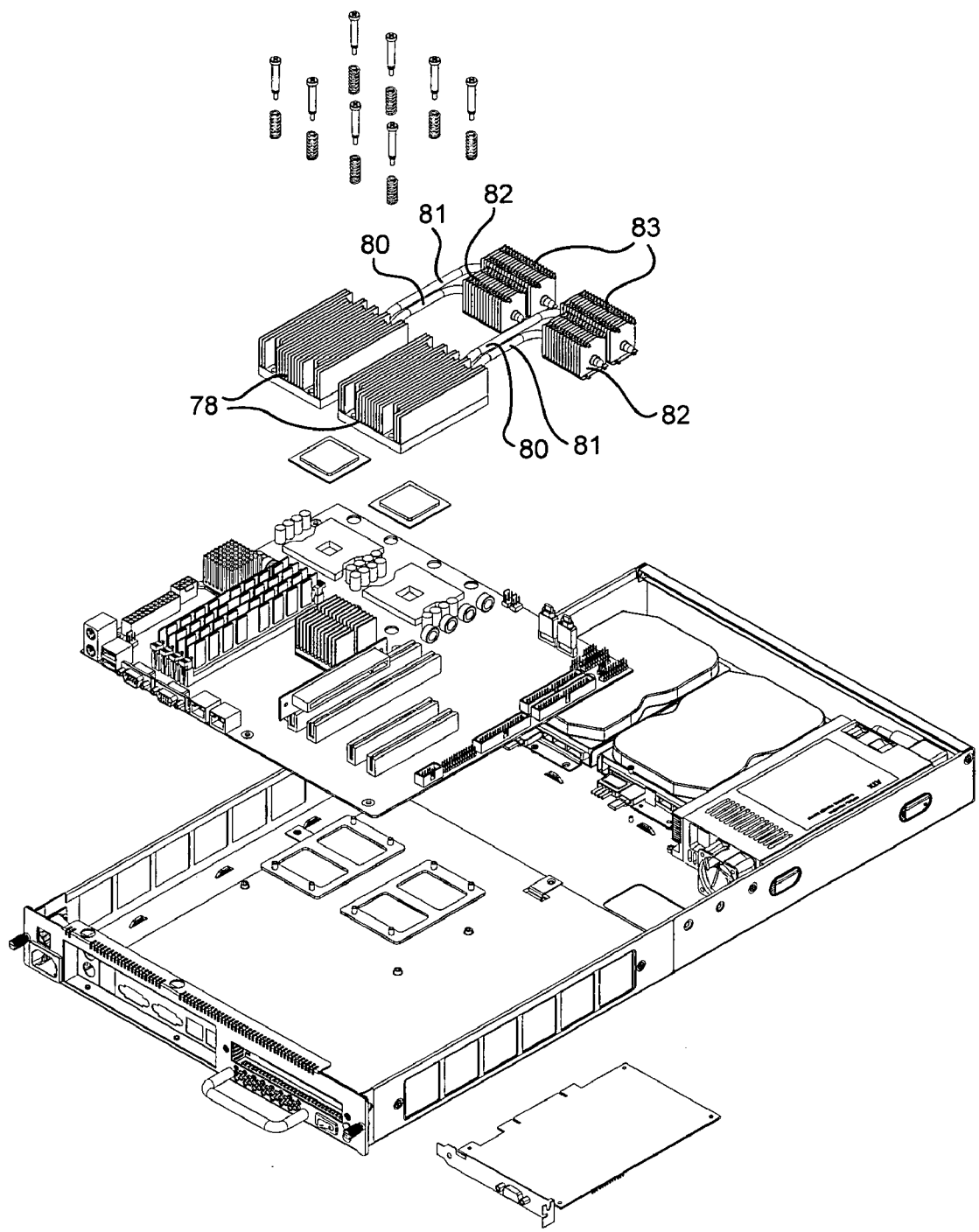
FIG. 27 is an exploded view of a fourth embodiment of an apparatus for cooling a blade server.
Figure 28:
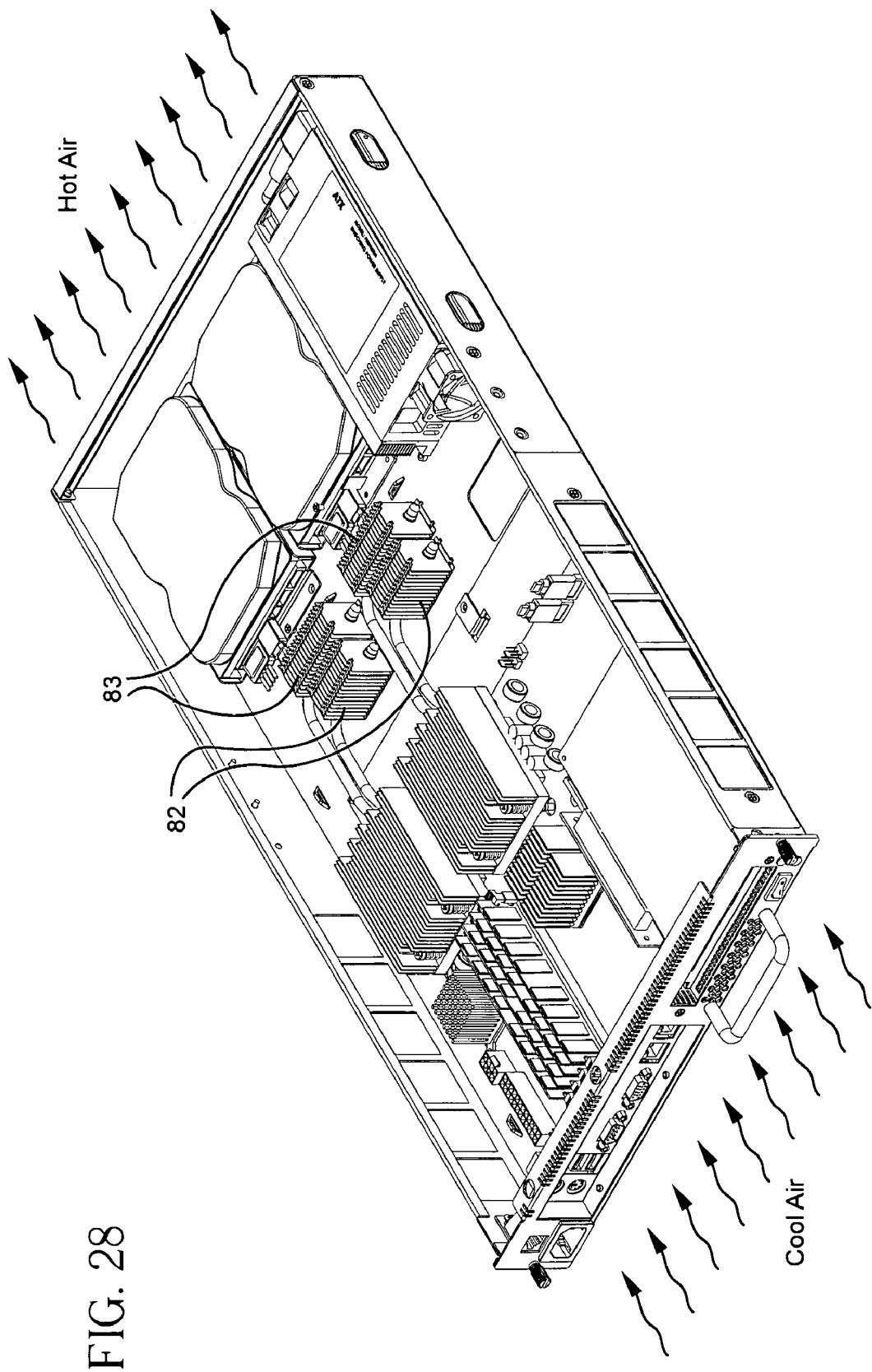
FIG. 28 is a perspective view of the fourth embodiment of an apparatus for cooling a blade server.
Figure 29:
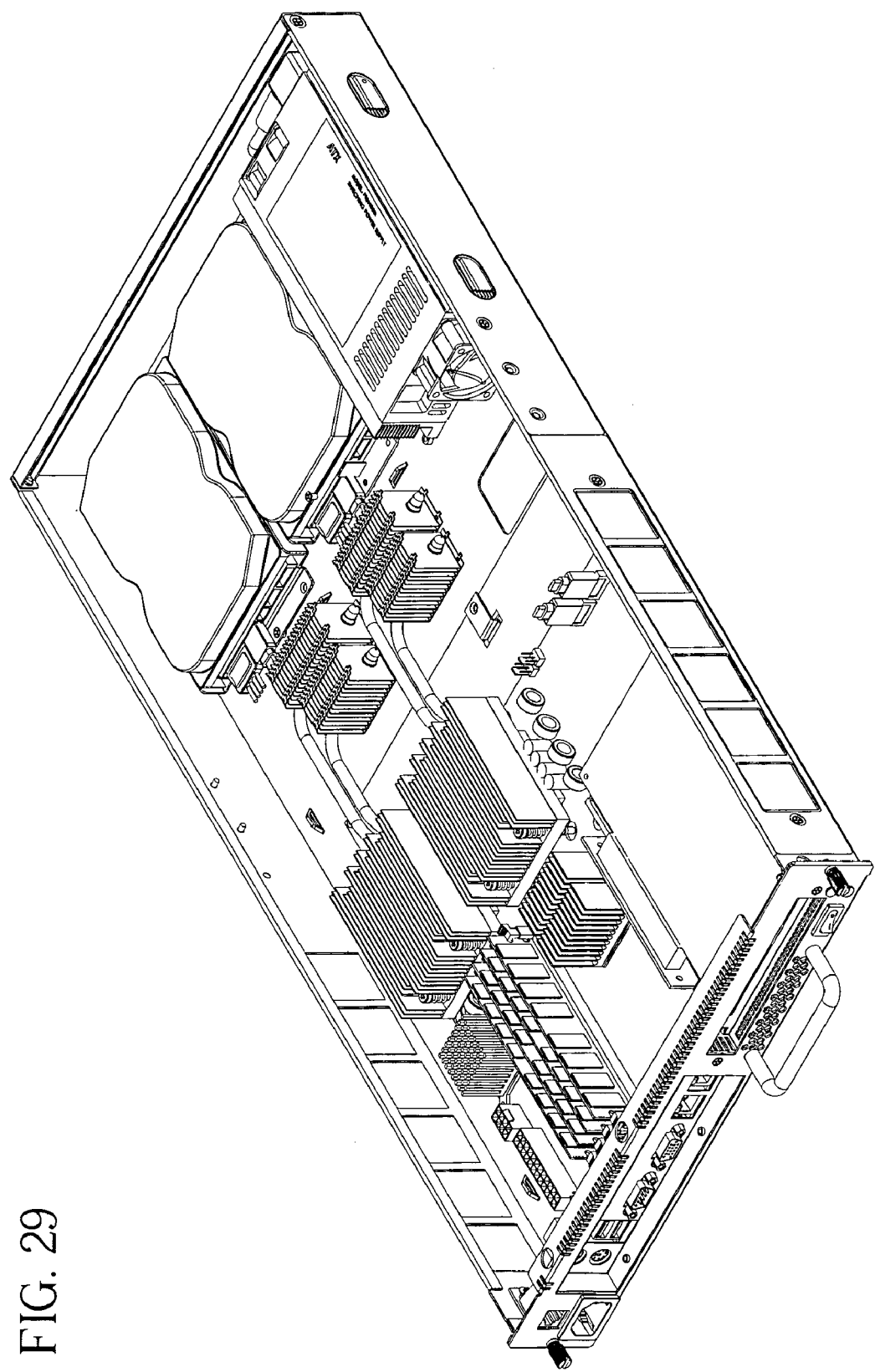
FIG. 29 is a perspective view of the fourth embodiment of an apparatus for cooling a blade server.

The heat transfer path of the fixed shape heat sink method of the fourth embodiment adapted for multiple heat sources is shown in FIGS. 27 and 28, and is summarized as follows.

1. Heat is transferred from heat sources to heat sinks 78.
2. Next, heat is transferred from heat sinks 78 through heat pipes 80 and 81 to a series of heat dissipating fins 82, 83 or heat exchanger.
3. The heat exchanger fins 82, 83 are preferably cooled by the cool air passing through the enclosure, as shown in FIG. 28, from the front to the rear of the enclosure.

The enclosure with the fixed-shape heat sink design is preferably inserted into a housing unit for cooling, as shown in FIG. 21. In the fixed-shape heat sink design, the cool air that flows into the enclosure preferably passes through heat exchangers 82, 83 shown in FIG. 27 in order to be effective. The heat exchangers 82 and 83 are aligned in parallel to each other. The parallel alignment of the heat dissipating fins of heat exchanger 82 and 83 allows the cool air to pass the exchangers in two stages. In the first stage, the cool air flows through the fins of heat exchanger 82 and removes most of the heat transferred from heat sinks 78. In the second stage, the semi-cooled air flows through heat exchanger 83 and further cools the heat sinks 78. The two-stage heat dissipating fin design offers the most optimized cooling solution for a heat source. The parallel alignment of the heat dissipating fins on heat exchangers 82 and 83 preferably intersect with the air flow paths to optimize cooling. This cooling concept may employ multiple heat exchangers, heat dissipating fins, in parallel to achieve maximum cooling efficiency.

Although illustrative embodiments of the present invention have been described herein with reference to the accompanying drawings, it is to be understood that the invention is not limited to those precise embodiments and that various other changes and modifications may be effective therein by one skilled in the art without departing from the scope or spirit of the invention.

What is claimed is:

1. A method of cooling a heat source on a circuit board adapted for operating in a rack-mountable housing comprising:

transferring heat from a heat source on the circuit board to a primary heat storage medium along an inner edge of a module at least partially surrounding the circuit board using at least one of a heat pipe and a water pipe;

transferring heat from the primary heat storage medium to a secondary heat storage medium along an outer edge of the module at least partially surrounding the circuit board, the primary and secondary heat storage mediums having complementary sloping contact surfaces that are in thermal contact with each other;

transferring heat from the secondary heat storage medium to a heat exchanger using at least one of a heat pipe and a water pipe; and cooling the heat exchanger, thereby cooling the heat source.

2. The method of cooling a heat source on a circuit board adapted for operating in a rack-mountable housing defined by claim 1, wherein the primary heat storage medium comprises at least one of aluminum, copper, and a heat transferring material.

3. The method of cooling a heat source on a circuit board adapted for operating in a rack-mountable housing defined by claim 1, wherein the secondary heat storage medium comprises at least one of aluminum, copper, and a heat transferring material.

4. The method of cooling a heat source on a circuit board adapted for operating in a rack-mountable housing defined by claim 1, further comprising:
   inserting the module into the rack-mountable housing such that the sloping contact surfaces are urged towards each other into thermal contact as the module is inserted into the rack-mountable housing.

5. The method of cooling a heat source on a circuit board adapted for operating in a rack-mountable housing defined by claim 1, wherein the heat exchanger comprises at least one of a fin and a water chiller.

6. The method of cooling a heat source on a circuit board adapted for operating in a rack-mountable housing defined by claim 1, wherein the primary heat storage medium comprises a sidewall of the module at least partially surrounding the circuit board.

7. The method of cooling a heat source on a circuit board adapted for operating in a rack-mountable housing defined by claim 1, further comprising:
   exerting force on the primary heat storage medium to urge the primary heat storage medium into thermal contact with the secondary heat storage medium; and
   securing the primary heat storage medium in thermal contact with respect to the secondary heat storage medium.

8. An apparatus adapted to cool a heat source on a circuit board adapted for operating in a rack-mountable housing comprising:
   a primary heat storage medium along an inner edge of a module at least partially surrounding the circuit board, the primary heat storage medium being adapted to transfer heat from a heat source on the circuit board using at least one of a heat pipe and a water pipe;
   a secondary heat storage medium along an outer edge of the module at least partially surrounding the circuit board, the secondary heat storage medium adapted to transfer heat from the primary heat storage medium, the primary and secondary heat storage mediums having complimentary sloping contact surfaces that are in thermal contact with each other; and
   a heat exchanger adapted to transfer heat from the secondary heat storage medium using at least one of a heat pipe and a water pipe, the heat exchanger being adapted to be cooled, thereby cooling the heat source.

9. The apparatus adapted to cool a heat source on a circuit board adapted for operating in a rack-mountable housing defined by claim 8, wherein the primary heat storage medium comprises at least one of aluminum, copper, and a heat transferring material.

10. The apparatus adapted to cool a heat source on a circuit board adapted for operating in a rack-mountable housing defined by claim 8, wherein the secondary heat storage medium comprises at least one of aluminum, copper, and a heat transferring material.

11. The apparatus adapted to cool a heat source on a circuit board adapted for operating in a rack-mountable housing defined by claim 8, wherein the sloping contact surfaces of the primary and secondary heat storage mediums are urged towards each other into thermal contact as as the module is inserted in the rack-mountable housing.

12. The apparatus adapted to cool a heat source on a circuit board adapted for operating in a rack-mountable housing defined by claim 8, wherein the heat exchanger comprises at least one of a fin and a water chiller.

13. The apparatus adapted to cool a heat source on a circuit board adapted for operating in a rack-mountable housing defined by claim 1, wherein the primary heat storage medium comprises a sidewall of the module at least partially surrounding the circuit board.

14. The apparatus adapted to cool a heat source on a circuit board adapted for operating in a rack-mountable housing defined by claim 8, further comprising:
   at least one screw adapted to exert force on the primary heat storage medium to urge the primary heat storage medium into thermal contact with the secondary heat storage medium and to secure the primary heat storage medium in thermal contact with respect to the secondary heat storage medium.

* * * * *